United States Patent
Salcedo et al.

(10) Patent No.: US 9,362,265 B2
(45) Date of Patent: *Jun. 7, 2016

(54) PROTECTION DEVICES FOR PRECISION MIXED-SIGNAL ELECTRONIC CIRCUITS AND METHODS OF FORMING THE SAME

(71) Applicant: Analog Devices, Inc., Norwood, MA (US)

(72) Inventors: Javier Alejandro Salcedo, North Billerica, MA (US); Srivatsan Parthasarathy, Marlborough, MA (US)

(73) Assignee: ANALOG DEVICES, INC., Norwood, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/593,477

(22) Filed: Jan. 9, 2015

(65) Prior Publication Data
US 2015/0115317 A1     Apr. 30, 2015

Related U.S. Application Data

(63) Continuation of application No. 13/423,720, filed on Mar. 19, 2012, now Pat. No. 8,946,822.

(51) Int. Cl.
*H01L 23/62* (2006.01)
*H01L 27/02* (2006.01)
*H01L 21/8222* (2006.01)

(52) U.S. Cl.
CPC ........ *H01L 27/0262* (2013.01); *H01L 21/8222* (2013.01); *H01L 27/0259* (2013.01)

(58) Field of Classification Search
CPC ............ H01L 27/0266; H01L 27/0255; H01L 27/0251; H01L 27/0262; H01L 27/0259
USPC .......................................... 257/343, 355, 360
See application file for complete search history.

(56) References Cited

U.S. PATENT DOCUMENTS 3,436,667 A     4/1969  Kedson
4,633,283 A    12/1986  Avery
(Continued)

FOREIGN PATENT DOCUMENTS

| DE | 10 2007 040 875 A1 | 3/2009 |
|---|---|---|
| EP | 0 168 678 A2 | 1/1986 |
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Anderson et al., *ESD Protection under Wire Bonding Pads*, EOS/ESD Symposium 99-88, pp. 2A.4.1-2A.4.7 (1999).
Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

(Continued)

*Primary Examiner* — Quoc Hoang
(74) *Attorney, Agent, or Firm* — Knobbe Martens Olson & Bear LLP

(57) ABSTRACT

Apparatus and methods for precision mixed-signal electronic circuit protection are provided. In one embodiment, an apparatus includes a p-well, an n-well, a poly-active diode structure, a p-type active region, and an n-type active region. The poly-active diode structure is formed over the n-well, the p-type active region is formed in the n-well on a first side of the poly-active diode structure, and the n-type active region is formed along a boundary of the p-well and the n-well on a second side of the poly-active diode structure. During a transient electrical event the apparatus is configured to provide conduction paths through and underneath the poly-active diode structure to facilitate injection of carriers in the n-type active region. The protection device can further include another poly-active diode structure formed over the p-well to further enhance carrier injection into the n-type active region.

20 Claims, 18 Drawing Sheets

(56) References Cited

U.S. PATENT DOCUMENTS

| | | |
|---|---|---|
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,541,801 A | 7/1996 | Lee et al. |
| 5,576,557 A | 11/1996 | Ker et al. |
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,940 A | 4/1999 | Kim |
| 5,998,813 A | 12/1999 | Bernier |
| 6,097,068 A | 8/2000 | Brown et al. |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,592,860 B2 | 11/2013 | Salcedo et al. |
| 8,665,571 B2 | 3/2014 | Salcedo et al. |
| 8,680,620 B2 * | 3/2014 | Salcedo ............ H01L 27/0262 257/355 |
| 8,891,212 B2 * | 11/2014 | Abou-Khalil ....... H01L 27/0262 361/56 |
| 8,946,822 B2 * | 2/2015 | Salcedo ............ H01L 27/0259 257/355 |
| 8,947,841 B2 | 2/2015 | Salcedo et al. |
| 2001/0040254 A1 | 11/2001 | Takiguchi |
| 2002/0021538 A1 | 2/2002 | Chen et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0195540 A1 | 9/2005 | Streibl et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2007/0007545 A1 | 1/2007 | Salcedo et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0057715 A1 | 3/2009 | Ryu et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0199874 A1 | 8/2012 | Salcedo et al. |
| 2012/0205714 A1 | 8/2012 | Salcedo et al. |
| 2012/0293904 A1 | 11/2012 | Salcedo et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |

OTHER PUBLICATIONS

Salcedo et al., *Electrostatic Discharge Protection Framework for Mixed-Signal High Voltage CMOS Applications*, IEEE Xplore, downloaded Feb. 23, 2010 at 12:53 EST, 4 pages.

Salcedo et al., *On-Chip Protection for Automotive Integrated Circuits Robustness*, 2012 8th International Caribbean Conference on Devices, Circuits and Systems (ICCDCS), 5 pages, Mar. 2012.

International Search Report and Written Opinion of the International Search Authority in PCT/US2013/03047, dated Jun. 27, 2013, 9 pages.

Salcedo et al., *Bidirectional Devices for Automotive-Grade Electrostatic Discharge Applications*, IEEE Electron Device Letters, vol. 33, No. 6, Jun. 2012, 3 pages.

Chang et al., *High-k Metal Gate-bounded Silicon Controlled Rectifier for ESD Protection*, 34th Electrical Overstress/Electrostatic Discharge Symposium, Sep. 2012, 7 pages.

\* cited by examiner

PROTECTION DEVICES FOR PRECISION MIXED-SIGNAL ELECTRONIC CIRCUITS AND METHODS OF FORMING THE SAME

CROSS REFERENCE TO RELATED APPLICATIONS

This application is a continuation of U.S. application Ser. No. 13/423,720, filed Mar. 19, 2012, entitled "APPARATUS AND METHOD FOR PROTECTION OF PRECISION MIXED-SIGNAL ELECTRONIC CIRCUITS," the entire disclosure of which is hereby incorporated herein by reference.

BACKGROUND

1. Field

Embodiments of the invention relate to electronic systems, and more particularly, to protection devices for integrated circuits (ICs), such as precision mixed signal ICs associated with a low capacitance and high voltage tolerant interface.

2. Description of the Related Technology

Certain electronic systems can be exposed to a transient electrical event, or an electrical signal of a relatively short duration having rapidly changing voltage and high power. Transient electrical events can include, for example, electro static discharge (ESD) events arising from the abrupt release of charge from an object or person to an electronic system.

Transient electrical events can destroy an integrated circuit (IC) inside an electronic system due to overvoltage conditions and high levels of power dissipation over relatively small areas of the IC. High power dissipation can increase IC temperature and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC. Processing technologies used for advanced mixed-signal applications can use nanoscale features, and conventional device architectures and topologies have proved insufficient to enable robust transient electrical event protection. Thus, there is a need to provide an IC with protection from such transient electrical events, such as during IC power-up and power-down conditions.

SUMMARY

In one embodiment an apparatus for providing protection from transient electrical events is provided. The apparatus includes a semiconductor substrate, a first well disposed in the semiconductor substrate, a second well disposed in the semiconductor substrate adjacent the first well, a first gate structure disposed over the second well, a first active region disposed on a first side of the first gate structure along a boundary of the first and second wells, a second active region disposed on a second side of the first gate structure in the second well, and a third active region disposed in the first well. The second well has a doping type opposite a doping type of the first well, the second active region has a doping type opposite a doping type of the first active region, and the third active region has a doping type the same as the doping type of the first active region. During a transient overvoltage stress event the apparatus is configured to provide a first conduction path under the first gate structure and a second conduction path through the first gate structure to decrease a turn-on response time and reduce a transient breakdown voltage between the first and second wells during the transient overvoltage stress event.

In another embodiment, an apparatus for providing protection from transient electrical events is provided. The apparatus includes a semiconductor substrate, a first well disposed in the semiconductor substrate, a second well disposed in the semiconductor substrate adjacent the first well, a first means for implant blocking disposed over the second well, a first active region disposed on a first side of the first implant blocking means along a boundary of the first and second wells, a second active region disposed on a second side of the first implant blocking means in the second well, and a third active region disposed in the first well. The second well has a doping type opposite a doping type of the first well, the second active region has a doping type opposite a doping type of the first active region, and the third active region has a doping type the same as the doping type of the first active region. During a transient overvoltage stress event the apparatus is configured to provide a first conduction path under the first implant blocking means and a second conduction path through the first implant blocking means to decrease a turn-on response time and reduce a transient breakdown voltage between the first and second wells during the transient overvoltage stress event.

DETAILED DESCRIPTION OF EMBODIMENTS

Figure 1:
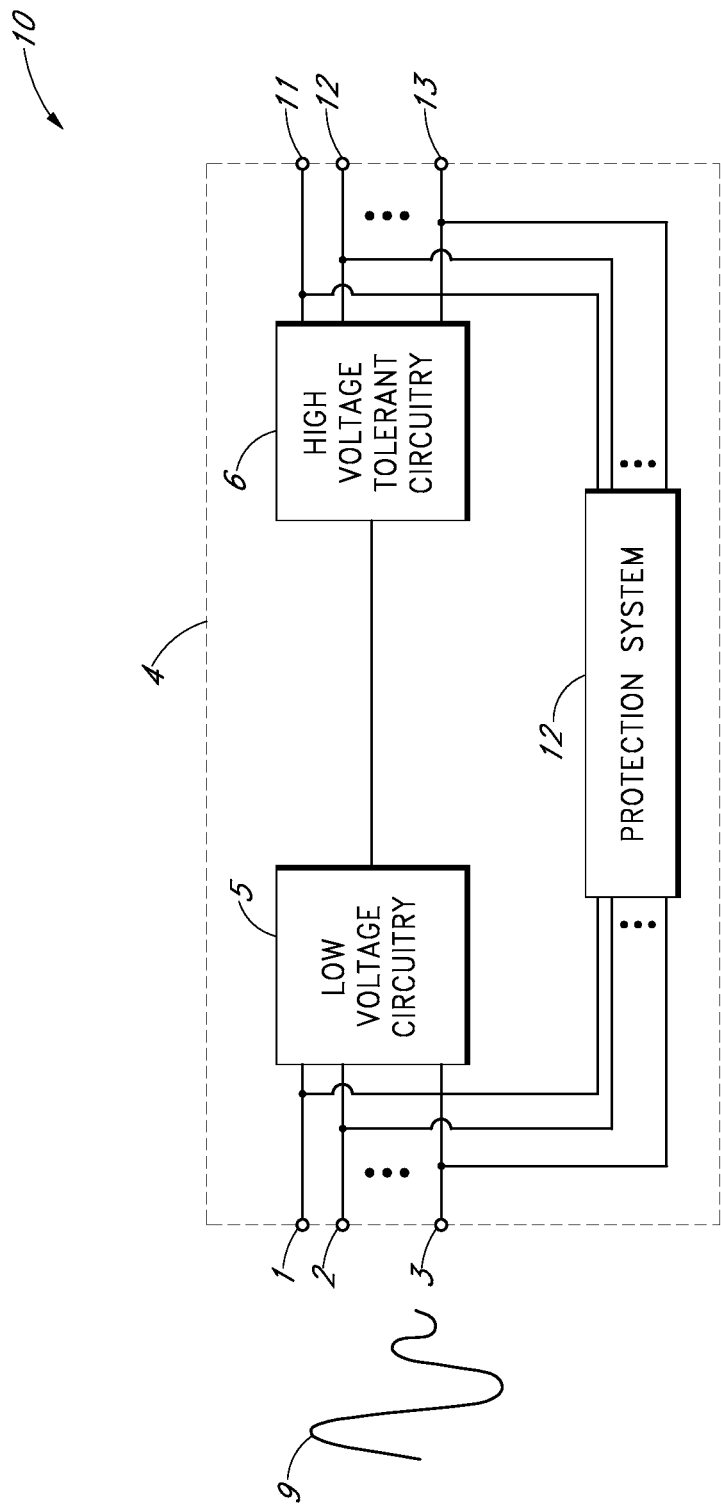
FIG. 1 is a schematic block diagram of one example of an electronic system including an integrated circuit (IC) with low voltage circuitry, high voltage tolerant circuitry, and a protection system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Certain electronic systems are configured to protect circuits or components therein from transient electrical events.

Furthermore, to help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient electrical events as discussed above, including ESD events.

Electronic circuit reliability can be improved by providing protection circuits or devices for the pads of an IC. The protection devices can maintain the voltage level at the pad within a predefined safe range.

In certain applications, it can be desirable for a protection device to exhibit bidirectional operation such that a protection device transitions from a high-impedance state to a low-impedance state when the voltage of the transient electrical event exceeds a forward trigger voltage in the positive direction or falls below a reverse trigger voltage in the negative direction. The protection device can be configured to shunt a portion of the current associated with the transient electrical event when in the low-impedance state, so as to prevent the voltage of a transient electrical event from either reaching a forward or reverse failure voltage associated with damage to the IC. As will be described in detail later with reference to FIG. 2, for transient electrical events having a positive voltage, the protection device can remain in the low-impedance state as long as the transient electrical event voltage remains above a forward holding voltage. Likewise, for negative transient signal events, the protection device can remain the low-impedance state as long as the transient electrical event voltage remains below a reverse holding voltage.

There is a need for a protection device that can be used to provide transient electrical event protection against both negative and positive transient signals. Additionally, there is a need for a low capacitance protection device that has fast operational speed, low static power dissipation, a small circuit area, and the ability to safely protect high-voltage tolerant pins. For example, these characteristics can be desirable in nanoscale ICs used in certain automotive, medical, and industrial processes, such as ICs used in high-speed signal processing, RF base stations, and/or in mixed voltage applications.

Overview of an Electronic System with a Protection System

FIG. 1 is a schematic block diagram of an electronic system 10, which can include one or more protection devices described herein. The illustrated electronic system 10 includes an integrated circuit (IC) 4 that includes a protection system 12, low voltage circuitry 5, high voltage tolerant circuitry 6, first to third pins or pads 1-3, and first to third high voltage pins or pads 11-13.

Each of the first to third pads 1-3 and the first to third high voltage tolerant pads 11-13 can be, for example, one of power-high pads, power-low pads, or signal pads. However, the first to third high voltage tolerant pads 11-13 can be exposed to an electrical environment that is harsher than the electrical environment that the first to third pads 1-3 are exposed to. For example, the first to third high voltage tolerant pads 11-13 can be exposed to transient electrical signals having a greater voltage magnitude than transient electrical signals that reach the first to third pads 1-3. Although the IC 4 illustrates a configuration including three pads 1-3 and three high voltage tolerant pads 11-13, the IC 4 can be adapted to include more or fewer pads and/or more or fewer high voltage tolerant pads.

As illustrated in FIG. 1, the low voltage circuitry 5 is electrically connected to the first to third pads 1-3, and the high voltage tolerant circuitry 6 is electrically connected to the first to third high voltage tolerant pads 11-13. In certain implementations, the high voltage tolerant circuitry 6 includes devices having a higher voltage tolerance than devices of the low voltage circuitry 5. For example, the high voltage tolerant circuitry 6 can include transistors having greater gate-to-source and/or gate-to-drain breakdown voltages. Additionally, in certain implementations, the high voltage tolerant circuitry 6 can include passive circuits, such as matching networks. As shown in FIG. 1, the low voltage circuitry 5 can be configured to electrically communicate with the high voltage tolerant circuitry 6. In certain implementations, the high voltage tolerant circuitry 6 is electrically connected to the low voltage circuitry 5 using one or more transformers.

The IC 4 can be exposed to transient electrical events, such as ESD events, which can cause IC damage or induce latch-up during normal operation. For example, as illustrated in FIG. 1, the third pad 3 can receive a transient electrical event 9, which can travel along electrical connections of the IC 4 and reach the low voltage circuitry 5. The transient electrical event 9 can produce overvoltage conditions and can dissipate high levels of power, which can disrupt the functioning of the low voltage circuitry 5 and potentially cause permanent damage to the IC 4. Although FIG. 1 illustrates the transient electrical event 9 reaching the third pad 3, the first and second pads 1, 2 and/or the first to third high voltage tolerant pads 11-13 can also be exposed to transient electrical events.

The protection system 12 can be provided to ensure reliability of the IC 4 by maintaining the voltage level at the pads of the IC 4 within a particular range of voltage, which can vary from pad to pad. The protection system 12 can include one or more protection circuits or devices, which can be configured to divert a current associated with a transient electrical event received on a pad of the IC to other nodes or pads of the IC, thereby providing transient electrical event protection, as will be described in further detail below.

Protection devices can be placed, for example, between a power-high pad and a signal pad, between a signal pad and a power-low pad, and/or between a power-high pad and a power-low pad. When no transient electrical event is present, the protection device can remain in a high-impedance/low-leakage state, thereby reducing static power dissipation resulting from leakage current. In the illustrated configuration, the protection system 12 has been configured to provide protection to the first to third pads 1-3 and to the first to third high voltage tolerant pads 11-13. However, other implementations are possible, such as configurations in which the protection system 12 protects the first to third pads 1-3, but not the first to third high-voltage pads 11-13, or configurations in which the protection system 12 protects the first to third high-voltage pads 11-13, but not the first to third pads 1-3.

As shown in FIG. 1, the protection system 12 can be integrated on-chip with the IC 4. However, in other embodiments, the protection system 12 can be arranged external to the IC 4. For example, the protection system 12 can be included in a separately packaged IC, or it can be encapsulated in a common package with the IC 4. In such embodiments, one or more protection devices can be placed in a stand-alone IC, in a common package for system-on-a-package applications, or integrated with an IC in a common semiconductor substrate for system-on-a-chip applications.

Although the protection system 12 is illustrated in the context of the IC 4, the protection system 12 can be used in a wide array of ICs and other electronics having pads configured to operate over a single voltage domain or over a multitude of voltage domains.

Figure 2:
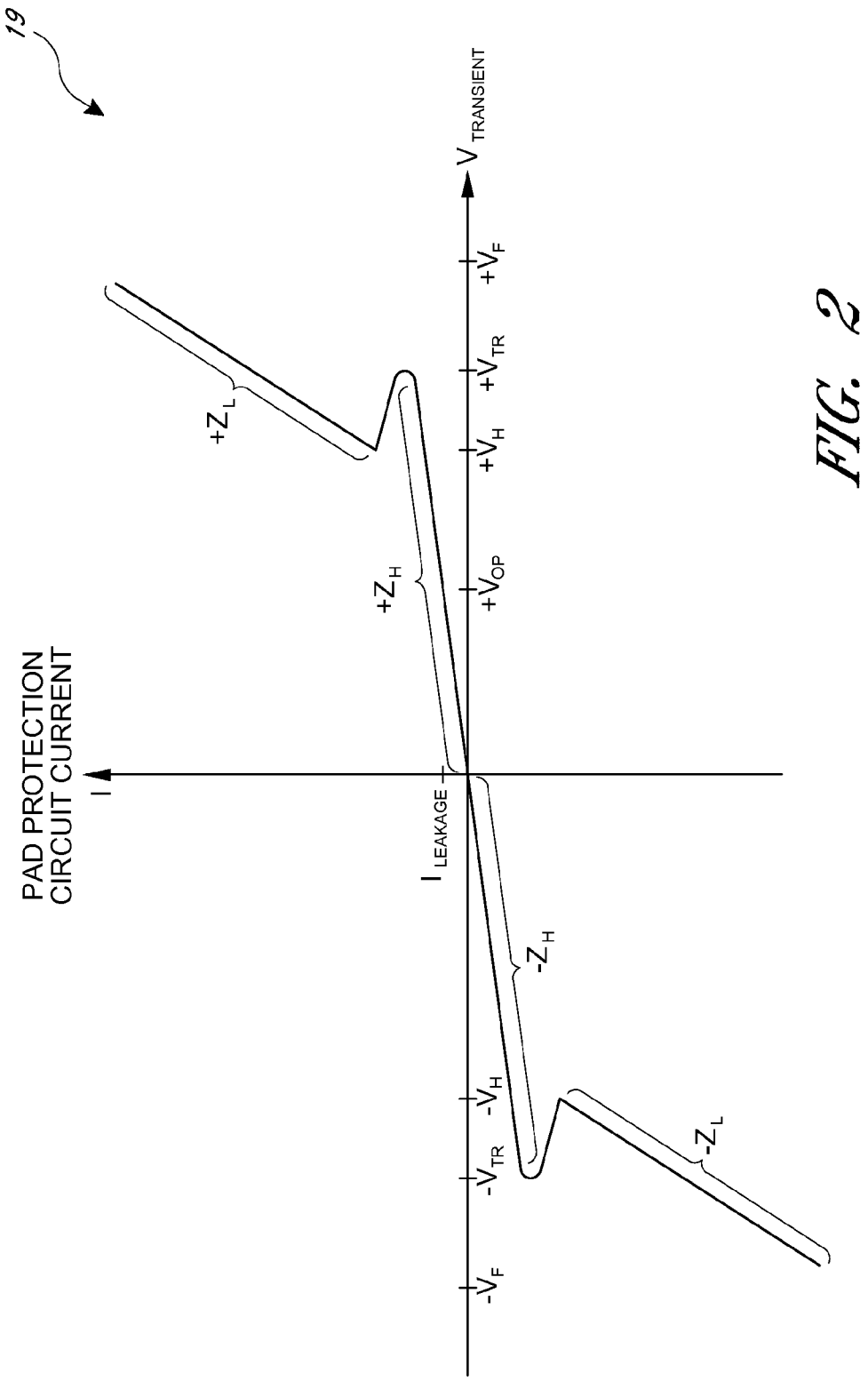
FIG. 2 is a graph of IC protection device current versus transient electrical event voltage in accordance with one embodiment.

FIG. 2 is a graph 19 of IC protection device current versus transient electrical event voltage in accordance with one embodiment. As described above, a protection device can be configured to maintain the voltage level at a pad within a predefined safe range. Thus, the protection device can shunt a large portion of the current associated with the transient electrical event before the voltage of the transient signal $V_{TRANSIENT}$ reaches either a positive failure voltage $+V_F$ or a negative failure voltage $-V_F$ that would otherwise cause damage to the IC. Additionally, the protection device can conduct a relatively low amount of current at the normal operating voltage $+V_{OP}$, thereby reducing or minimizing static power dissipation resulting from the leakage current $I_{LEAKAGE}$, which enhances the energy efficiency of the IC.

Furthermore, as shown in the graph 19, the protection device can transition from a high-impedance state $+Z_H$ to a low-impedance state $+Z_L$ when the voltage of the transient signal $V_{TRANSIENT}$ reaches a positive trigger voltage $+V_{TR}$. Thereafter, the pad circuit can shunt a large amount of current over a wide range of transient signal voltage levels. The pad circuit can remain in the low-impedance state $+Z_L$ as long as the transient signal voltage level is above a positive holding voltage $+V_H$. By configuring the protection device to have a trigger voltage $+V_{TR}$ and a holding voltage $+V_H$, the protection device can have improved performance while having enhanced stability against unintended activation. In certain implementations, it can be specified for the holding voltage $+V_H$ to be above the operating voltage $+V_{OP}$ such that the protection device does not remain in the low-impedance state $+Z_L$ after passage of the transient signal event and a return to normal operating voltage levels.

In the illustrated embodiment, the protection device can also shunt a large amount of current for transient electrical events having a negative voltage, so that the protection device can provide transient electrical event protection against both negative and positive transient signals. The protection device can transition from a high-impedance state $-Z_H$ to a low-impedance state $-Z_L$ when the voltage of the transient signal $V_{TRANSIENT}$ reaches a negative trigger voltage $-V_{TR}$, thereby shunting a large negative amount of current. The pad circuit can remain in the low-impedance state $-Z_L$ as long as the voltage magnitude of the negative transient signal is greater than the voltage magnitude of the negative holding voltage $-V_H$.

In FIG. 2, voltage is expressed along a horizontal axis, and current is expressed along a vertical axis. In the illustrated embodiment, the protection device has I-V characteristics that are symmetrical. In other implementations, the protection devices described herein can have asymmetrical I-V characteristics. For example, protection devices can have different trigger voltages, holding voltages, and/or failure voltages with different I-V curves in the positive and negative regions of the graph.

It can be difficult to provide a protection device having a sufficiently high trigger voltage, particularly when providing the protection device on an IC fabricated using a low voltage semiconductor processing technology, for instance subnanoscale feature technologies. Additionally, it can be difficult to provide a protection device that has a relatively fast turn-on speed so as to prevent voltage overshoot from damaging low voltage devices. Furthermore, it can be difficult to provide a protection device that has a relatively small parasitic capacitance so as to provide protection from transient electrical events without substantially impacting signal bandwidth of high frequency signal pins. As will be described herein, protection devices are provided that can have a relatively low capacitance, a relatively fast operational speed, relatively low static power dissipation, high voltage tolerance, and a relatively small circuit area. Additionally, in certain implementations, protection devices are provided that can be made using semiconductor layers and regions associated with a typical low voltage semiconductor process, for instance, nanoscale complementary metal oxide semiconductor (CMOS) technologies.

Overview of Embodiments of Protection Devices

Figure 3A:
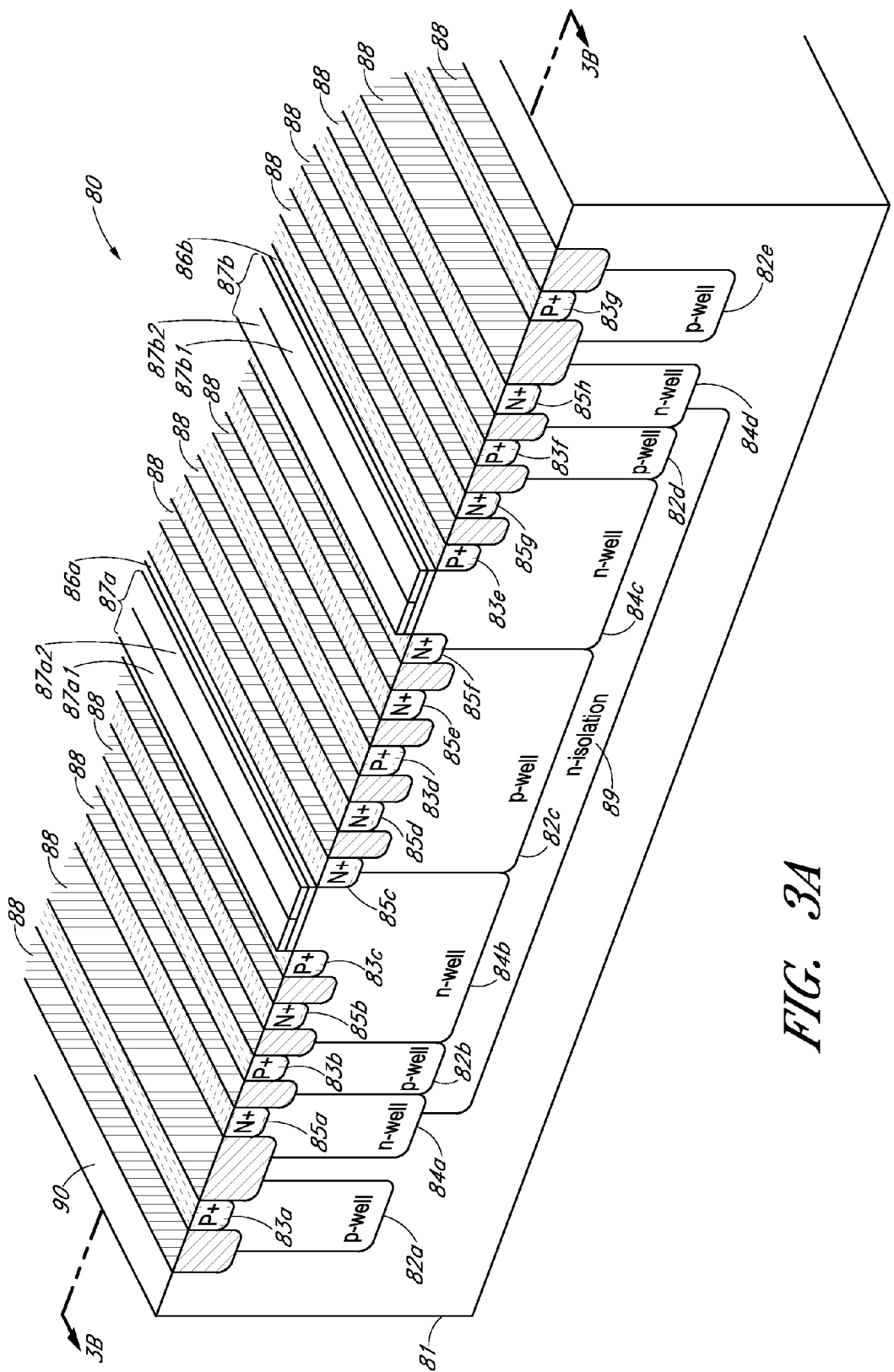
FIG. 3A is a schematic perspective view of a protection device according to one embodiment.

FIG. 3A is a schematic perspective of a protection device 80 according to one embodiment. The protection device 80 includes a p-type doped (herein "p-type") semiconductor substrate 81, first to fifth p-wells 82a-82e, first to seventh p-type active areas 83a-83g, first to fourth n-wells 84a-84d, first to eighth n-type doped (herein "n-type") active areas 85a-85h, first and second gate oxide layers 86a, 86b, first and second gate regions 87a, 87b, oxide regions 88, and n-type isolation layer 89.

As illustrated in FIG. 3A, the substrate 81 includes the first to fourth n-wells 84a-84d and the first to fifth p-wells 82a-82e formed therein. The second and third n-wells 84b, 84c are disposed on opposite sides of the third p-well 82c. The second p-well 82b is disposed on a side of the second n-well 84b opposite the third p-well 82c. The fourth p-well 82d is disposed on a side of the third n-well 84c opposite the third p-well 82c. The first n-well 84a is disposed on a side of the second p-well 82b opposite the second n-well 84b. The fourth n-well 84d is disposed on a side of the fourth p-well 82d opposite the third n-well 84c. The n-type isolation layer 89 is disposed beneath the second and third n-wells 84b, 84c, beneath the second to fourth p-wells 82b-82d, and beneath a portion of the first and fourth n-wells 84a, 84d. The first p-well 82a is formed adjacent the first n-well 84a on a side of the first n-well 84a opposite the second p-well 82b. The fifth p-well 82e is formed adjacent the fourth n-well 84d on a side of the fourth n-well 84d opposite the fourth p-well 82d.

In the illustrated configuration, the second p-well 82b abuts the first and second n-wells 84a, 84b, the third p-well 82c abuts the second and third n-wells 84b, 84c, the fourth p-well 82d abuts the third and fourth n-wells 84c, 84d, and the first and fifth p-wells 82a, 82e are spaced from the first and fourth n-wells 84a, 84d, respectively, such that the first p-well 82a does not abut the first n-well 84a and the fifth p-well 82e does not abut the fourth n-well 84d. However, other implementations are possible, including, for example, configurations in which the first p-well 82a abuts the first n-well 84a and the fifth p-well 82e abuts the fourth n-well 84d.

The first and seventh p-type active areas 83a, 83g are disposed in the first and fifth p-wells 82a, 82e, respectively. The second and sixth p-type active areas 83b, 83f are disposed in the second and fourth p-wells 82b, 82d, respectively. The first and eighth n-type active areas 85a, 85h are disposed in the first and fourth n-wells 84a, 84d, respectively. The fourth p-type active area 83d is disposed in the third p-well 82c. The fourth n-type active area 85d is disposed in the third p-well 82c on a side of the fourth p-type active area 83d facing the second n-well 84b. The fifth n-type active area 85e is disposed in the third p-well 82c on a side of the fourth p-type active area 83d facing the third n-well 84c.

The first and second gate oxide layers 86a, 86b are disposed on a surface 90 of the substrate 81 over the second and third n-wells 84b, 84c, respectively. The first and second gate regions 87a, 87b are disposed over the first and second gate oxide layers 86a, 86b, respectively, and can be polysilicon layers. The third p-type active area 83c is disposed in the second n-well 84b on a first side of the first gate region 87a. The third n-type active area 85c is disposed on a second side of the first gate region 87a, and includes a first portion disposed in the second n-well 84b and a second portion disposed in the third p-well 82c. The second n-type active area 85b is disposed in the second n-well 84b on a side of the third p-type active area 83c opposite the first gate region 87a. The fifth p-type active area 83e is disposed in the third n-well 84c on a first side of the second gate region 87b. The sixth n-type active area 85f is disposed on a second side of the second gate region 87b, and includes a first portion disposed in the third n-well 84c and a second portion disposed in the third p-well 82c. The seventh n-type active area 85g is disposed in the third n-well 84c on a side of the fifth p-type active area 83e opposite the second gate region 87b.

The first gate region 87a includes a first p-type gate region or p-type doped poly-crystalline gate region 87a1 adjacent the third p-type active area 83c and a first n-type gate region or n-type doped poly-crystalline gate region 87a2 adjacent the third n-type active area 85c. Additionally, the second gate region 87b includes a second p-type gate region 87b1 adjacent the fifth p-type active area 83e and a second n-type gate region 87b2 adjacent the sixth n-type active area 85f. As will be described in detail below with respect to FIG. 3B, configuring the first and second gate regions 87a, 87b to each include a p-type gate region and an n-type gate region can enhance the turn-on speed and/or amplify transient coupling of the protection device 80 during a transient electrical event.

In the illustrated embodiment, the protection device 80 is formed in the substrate 81, which can be a p-type substrate. In another embodiment, the substrate can include a p-type epitaxial layer formed on a silicon (Si) substrate. Although not illustrated in FIG. 3A, the substrate 81 can also include other devices or structures formed therein.

In one embodiment, the first to fifth p-wells 82a-82e and the first to fourth n-wells 84a-84d can be similar to one another, and can have a depth ranging between about 1.5 μm and about 5.5 μm from the surface 90 of the substrate 81. In one implementation, the first to seventh p-type active areas 83a-83g and the first to eighth n-type active areas 85a-85h have a depth that is about 15 times to about 25 times less than a depth of the well within which the active area is formed. The oxide regions 88 can have any suitable depth, such as depth that is about 5 times to about 15 times less than the depth of the first to fifth p-wells 82a-82e. In certain implementations, the oxide regions 88 can be relatively deeper than the first to seventh p-type active areas 83a-83g and the first to eighth n-type active areas 85a-85h.

The first and fourth n-wells 84a, 84d and the n-type isolation layer 89 can aid in electrically isolating the second to fourth p-wells 82b-82d from the substrate 81, thereby permitting the p-type substrate 81 and the second to fourth p-wells 82b-82d to operate at different electrical potentials. As used herein, and as will be understood by one of skill in the art, the term "n-type isolation layer" refers to any suitable n-type isolation layer, including, for example, those used in silicon-on-insulator (SOI) technologies, buried n-layer technologies, or in deep n-well technologies. Although the protection device 80 is illustrated as including the first and fourth n-wells 84a, 84d and the n-type isolation layer 89, in certain implementations, the protection device 80 can be isolated from a substrate in other ways. For example, isolation can be achieved when using silicon-on-insulator (SOI) processes by using dielectric structures. SOI processes can be employed in a variety of applications, including, for example, applications having high electrical robustness requirements. Although the protection device 80 is illustrated as including the first and fourth n-wells 84a, 84d and the n-type isolation layer 89, in certain implementations, such as high frequency configurations, the first and fourth n-wells 84a, 84d and the n-type isolation layer 89 can be omitted in favor of forming the second to third p-wells 82b-82d and the second and third n-wells 84b, 84c directly in the substrate 81.

The first and fifth p-wells 82a, 82e and the first and seventh p-type active areas 83a, 83g can form a guard ring around the protection device 80. The guard ring can be employed to eliminate the formation of unintended parasitic paths between the protection device 80 and surrounding semiconductor components when integrated on-chip.

The illustrated protection device 80 includes the oxide regions 88. Formation of the isolation regions can involve etching trenches in the substrate 81, filling the trenches with a dielectric, such as silicon dioxide ($SiO_2$), and removing the excess dielectric using any suitable method, such as chemical-mechanical planarization. In certain implementations, the oxide regions 88 can be shallow trench regions, or any other suitable dielectric regions disposed between active areas.

The protection device 80 can undergo back end processing to form contacts and metallization. Skilled artisans will appreciate that these details have been omitted from this figure for clarity.

Figure 3B:
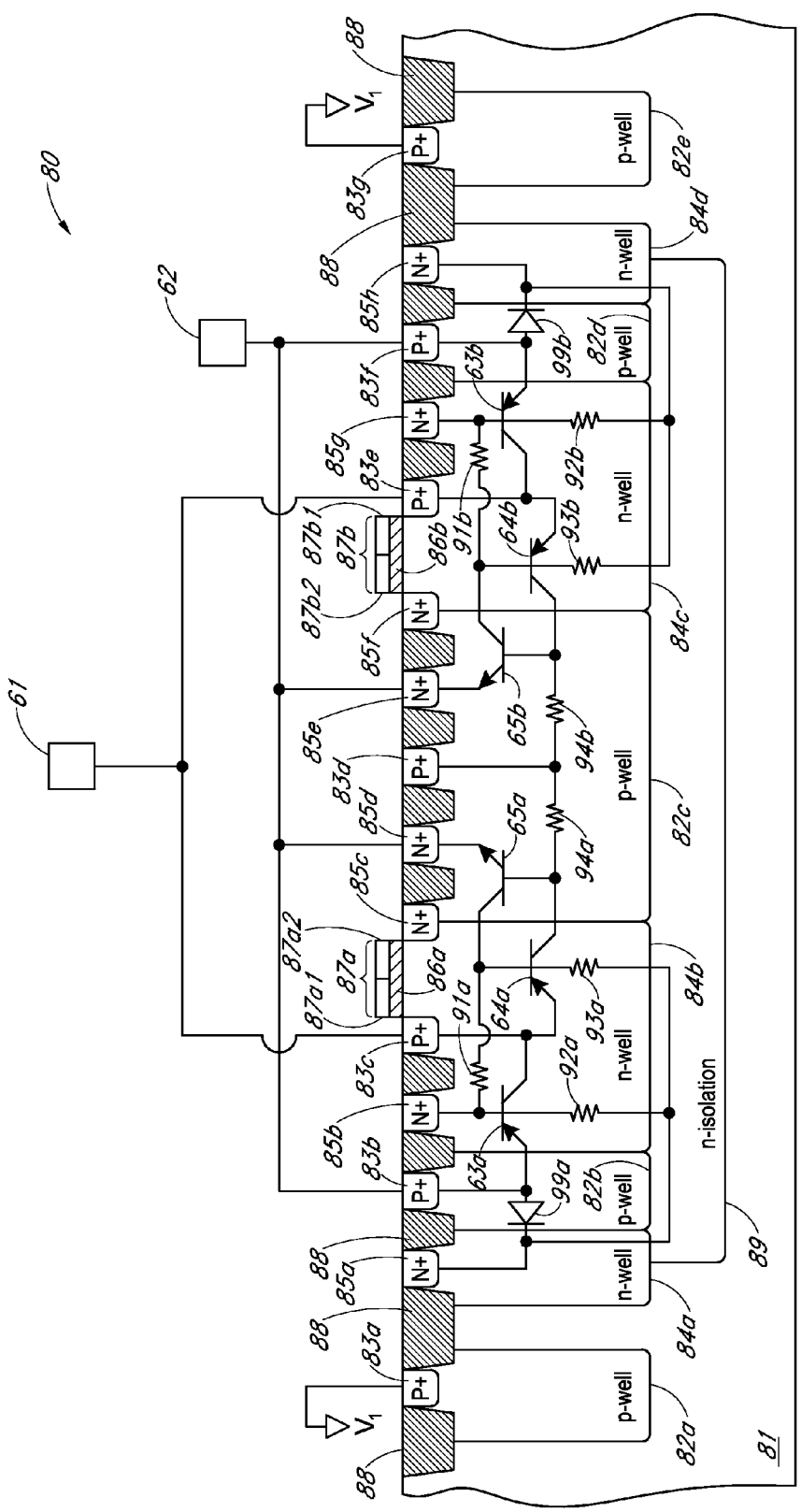
FIG. 3B is an annotated cross section view of the protection device of FIG. 3A, taken along the lines 3B-3B.

FIG. 3B is an annotated cross section view of the protection device 80 of FIG. 3A, taken along the lines 3B-3B. The protection device 80 includes the p-type substrate 81, the first to fifth p-wells 82a-82e, the first to seventh p-type active areas 83a-83g, the first to fourth n-wells 84a-84d, the first to eighth n-type active areas 85a-85h, the first and second gate oxide layers 86a, 86b, the first and second gate regions 87a, 87b, the oxide regions 88, and the n-type isolation layer 89, which can be as described above with respect to FIG. 3A.

The cross section shows examples of equivalent circuit devices formed from the illustrated structure, such as first and second PNP bipolar transistors 64a, 64b, first and second NPN bipolar transistors 65a, 65b, first and second open-base PNP bipolar transistors 63a, 63b, a first resistor 91a, a second resistor 91b, a third resistor 92a, a fourth resistor 92b, a fifth resistor 93a, a sixth resistor 93b, a seventh resistor 94a, an eighth resistor 94b, and first and second diodes 99a, 99b. Additionally, the cross section has been annotated to show the first and second pads 61, 62 as well as electrical connections within the protection device 80 and to the pads.

The first pad 61 is electrically connected to the third and fifth p-type active areas 83c, 83e. The second pad 62 is electrically connected to the second and sixth p-type active areas 83b, 83f and to the fourth and fifth n-type active areas 85d, 85e. The first and seventh p-type active areas 83a, 83g are electrically connected to the first supply voltage $V_1$, which can be, for example, a power-low or ground supply used to control the electrical potential of the substrate 81.

The first and second PNP bipolar transistors 64a, 64b can be formed from the third and fifth p-type active areas 83c, 83e, from the second and third n-wells 84b, 84c, and from the third p-well 82c, and can be lateral parasitic PNP bipolar devices. For example, the first PNP bipolar transistor 64a can have an emitter formed from the third p-type active area 83c, a base formed from the second n-well 84b, and a collector formed from the third p-well 82c. Additionally, the second PNP bipolar transistor 64b can have an emitter formed from the fifth p-type active area 83e, a base formed from the third n-well 84c, and a collector formed from the third p-well 82c. The first and second NPN bipolar transistors 65a, 65b can be formed from the second and third n-wells 84b, 84c, the third p-well 82c, and the fourth and fifth n-type active areas 85d, 85e, and can be lateral parasitic NPN bipolar devices. For example, the first NPN bipolar transistor 65a can have an emitter formed from the fourth n-type active area 85d, a base formed from the third p-well 82c, and a collector formed from the second n-well 84b. Additionally, the second NPN bipolar transistor 65b can have an emitter formed from the fifth n-type active area 85e, a base formed from the third p-well 82c, and a collector formed from the third n-well 84c. The first and second open-base PNP bipolar transistors 63a, 63b can be formed from the second and fourth p-wells 82b, 82d, the second and third n-wells 84b, 84c, and the third and fifth p-type active areas 83c, 83e, and can be lateral parasitic PNP bipolar devices. For example, the first open-base PNP bipolar transistor 63a can have an emitter formed from the second p-well 82b, a base formed from the second n-well 84b, and a collector formed from the third p-type active area 83c. Additionally, the second open-base PNP bipolar transistor 63b can have an emitter formed from the fourth p-well 82d, a base formed from the third n-well 84c, and a collector formed from the fifth p-type active area 83e.

The first and second resistors 91a, 91b can be formed from the second and third n-wells 84b, 84c, respectively, utilizing the resistance therein. Additionally, the third and fifth resistors 92a, 93a can be formed from the first and second n-wells 84a, 84b and the n-type isolation layer 89, utilizing the resistance therein. Furthermore, the fourth and sixth resistors 92b, 93b can be formed from the third and fourth n-wells 84c, 84d and the n-type isolation layer 89, utilizing the resistance therein. Additionally, the seventh and eighth resistors 94a, 94b can be formed from the third p-well 82c, utilizing the resistance therein. The first diode 99a can have an anode formed from the second p-well 82b and a cathode formed from the first n-well 84a. The second diode 99b can have an anode formed from the fourth p-well 82d and a cathode formed from the second n-well 84b.

In the illustrated configuration, the protection device 80 does not include conventional metal oxide semiconductor (MOS) transistor formation, since active areas of different doping polarities have been implanted on opposing sides of the first and second gate regions 87a, 87b. Rather, the gate regions 87a, 87b have been used as a self-aligned implant mask when doping the third and fifth p-type active areas 83c, 83e and the third and sixth n-type active areas 85c, 85f, which also creates a well-defined separation between the active areas implanted.

The protection device 80 can protect an IC from a transient electrical event having either positive or negative voltage amplitude. For example, when a negative transient electrical event causes the voltage of the first pad 61 to decrease relative to the voltage of the second pad 62, the first and second open-base PNP bipolar transistors 63a, 63b can operate as a reverse conduction path to provide protection to the IC. The reverse conduction path can have a breakdown voltage associated with a collector-emitter breakdown voltage of the first and second open-base PNP bipolar transistors 63a, 63b. By electrically floating the second and third n-wells 84b, 84c that operate as the bases of the first and second open-base PNP bipolar transistors 63a, 63b, respectively, the collector-emitter breakdown voltage of the first and second open-base PNP bipolar transistors 63a, 63b can be increased.

The first and second PNP bipolar transistors 64a, 64b and the first and second NPN bipolar transistors 65a, 65b can operate as a forward conduction path to provide protection against a positive transient electrical event that causes the voltage of the first pad 61 to increase relative to the voltage of the second pad 62. For example, as the voltage of the first pad 61 increases relative to the voltage of the second pad 62, the voltage across the first and second PNP bipolar transistors 64a, 64b and the voltage across the first and second NPN bipolar transistors 65a, 65b can increase. As skilled artisans will appreciate, the first PNP bipolar transistor 64a and the first NPN bipolar transistor 65a are cross-coupled in a feedback configuration, and at a certain level of voltage difference between the first and second pads 61, 62 the feedback between the first PNP bipolar transistor 64a and the first NPN bipolar transistor 65a can be regenerative and cause the first PNP bipolar transistor 64a and the first NPN bipolar transistor 65a to enter a low-impedance state. Likewise, at a certain level of voltage difference between the first and second pads 61, 62, the feedback between the second PNP bipolar transistor 64b and the second NPN bipolar transistor 65b can be regenerative and can cause the second PNP bipolar transistor 64b and the second NPN bipolar transistor 65b to enter a low-impedance state. The transition of the cross-coupled bipolar transistors into the low-impedance state and the resulting conductivity modulation of the protection device 80 can be associated with high carrier injection relative to normal operating conditions. The injected carriers can be associated with, for example, the injection of holes from the third and fifth p-type active regions 83c, 83e into the second and third n-wells 84b, 84c and the injection of electrons from the fourth and fifth n-type active regions 85d, 85e into the third p-well 82c.

Inclusion of the first and second gate regions 87a, 87b aids in improving the transient performance of the protection device 80 by facilitating the injection of carriers into the third p-well 82c so as to decrease the response time and lower the voltage at which the cross-coupled PNP bipolar transistors 64a, 64b and NPN bipolar transistors 65a, 65a trigger. In particular, a transient signal event can be associated with fast rise and fall times (for example, from about 0.2 ns to about 15 ns) relative to the range of normal signal operating conditions. When a positive transient electrical event is received between the first and second pads 61, 62, a capacitance-driven displacement current can flow from the first pad 61 to the first and second gate regions 87a, 87b, which can increase the voltage of the first and second gate regions 87a, 87b and provide a conduction path under the first and second gate regions 87a, 87b for which carriers can reach the third and sixth n-type active areas 85c, 85f. Additionally, the first and second gate regions 87a, 87b themselves can operate as a conduction path for transient signals through which a capacitive-driven displacement current can flow from the first pad 61 to the third and sixth n-type active areas 85c, 85f.

Configuring the protection device 80 to include the first and second gate regions 87a, 87b aids in injecting carriers into the collector-base junctions of the PNP bipolar transistors 64a, 64b and into the collector-base junctions of the NPN bipolar transistors 65a, 65b. By enhancing feedback between the cross-coupled bipolar transistors in this manner can reduce a breakdown voltage between the third p-well 82c and the second and third n-wells 84b, 84c during stress conditions while beneficially maintaining relatively high quasi-static DC blocking voltage characteristics. Additionally, configuring the protection device 80 in this manner can provide a direct conduction path closer to the surface of the substrate 81 beneath the first and second gate regions 87a, 87b, thereby reducing the base transit time of the first and second PNP bipolar transistors 64a, 64b. Reducing base transit time can reduce the forward trigger voltage of the protection device 80 and improve the response time of the protection device 80 during a transient electrical event.

Accordingly, the first and second gate regions 87a, 87b can be used to help create direct carriers injection paths of the third and sixth n-type active areas 85c, 85f, thereby helping to activate the forward conduction path of the protection device 80 during a positive transient electrical event. However, during normal operating conditions, even at relatively high quasi-static voltages, the impedance between the first pad 61 and the third and sixth n-type active areas 85c, 85f can be relatively high, thereby providing enhanced protection against unintended activation of the protection device 80. Thus, the configuration illustrated in FIG. 3B can be configured to provide a forward trigger voltage which decreases in response to rates of high power and voltage change associated with the conditions of a transient signal stress events such as electrostatic discharge events.

The performance of the protection device 80 can be further enhanced by configuring the first gate region 87a to include the first p-type gate region 87a1 and the first n-type gate region 87a2, and by configuring the second gate region 87b to include the second p-type gate region 87b1 and the second n-type gate region 87b2. In particular, the first and second n-type gate regions 87a2, 87b2, the first and second gate regions 87a, 87b can form p-n junction diodes that can reduce the response time at which direct lateral conduction paths are formed beneath the first and second gate regions 87a, 87b during a transient electrical event. Additionally, the highly-doped p-n junction poly structures formed can also increase the amount of capacitor-driven displacement current that flows from the first pad 81a to the third and sixth n-type active areas 85c, 85f by reducing the impedance of the first and second gate regions 87a, 87b to transient signals that have a positive voltage with respect to the first pad 61a.

The protection device 80 can protect an IC from a transient electrical event having either positive or negative voltage polarity. Using a single protection device 80 to provide protection against both positive and negative transient electrical events can permit a reduction in layout area relative to a design that uses separate structures for protection against positive and negative transient electrical events.

Although FIG. 3B illustrates one embodiment of the connectivity of the protection device 80, other configurations are possible.

For example, in some embodiments the first and eighth n-type active areas 85a, 85h are electrically connected in other ways. For instance, in some implementations, the first and eighth n-type active areas 85a, 85h are electrically connected to a DC voltage source, such as a power-high supply. Connecting the n-type active areas 85a, 85h to a power-high voltage supply creates a stronger reverse-biased junction between the substrate 81 and the isolation structure formed from the n-wells 84a-84d and the n-type isolation layer 89. Additionally, biasing the first and eighth n-type active areas 85a, 85h also creates a stronger reverse-bias of the emitter-base junctions of the PNP bipolar transistors 64a, 64b, which increases the breakdown voltage and decreases the leakage current of the protection device during normal IC operation.

Additionally, in some implementations, the first and eighth n-type active areas 85a, 85h are electrically connected to the first pad 61. In such configurations, the first and second diodes 99a, 99b can aid in providing protection against negative transient electrical events. However, electrically connecting the first and eighth n-type active areas 85a, 85h to the first pad 61 also connects the fifth and sixth resistors 93a, 93b between the emitter-base junctions of the first and second PNP bipolar transistors 64a, 64b, respectively. Inclusion of these resistors assists in shifting the breakdown voltage of the first and second PNP bipolar transistors 64a, 64b from the lower open-base breakdown (herein, "BVCEO") to a slightly higher emitter-base-resistor driven breakdown (herein, "BVCER"). Configuring the device in this manner allows for fine tuning of the blocking voltage characteristics of the device without addition of external discrete components, such as resistors. Additionally, increasing the blocking voltage in this manner allows for modification of the device characteristics to accommodate performance or specification requirements associated with high voltage tolerant pins, as will be discussed in connection with other embodiments for addressing specific design constraints in precision mixed-signals ICs.

Accordingly, configurations of the protection device 80 that connect the first pad 61 to the first and eighth n-type active areas 85a, 85h can have a higher forward breakdown between the first pad 61 and the second pad 62 and lower forward-biased diode for reverse conduction between the second pad 62 and the first pad 61. The electrical potential of the bases of the PNP bipolar transistors 63a-63b, 64a-64b can be controlled through a resistor defined by the resistance of the first and second n-type active areas 85a, 85h, the resistance of the first to fourth n-wells 84a-84d, and the resistance of the n-type isolation layer 89. By tuning the doping and spacing of the regions defining this resistor, the breakdown voltages of the protection device 80 can be controlled while maintaining fast device response time upon stress.

Furthermore, in some embodiments, such as implementations associated with a relatively low reverse breakdown voltage, the second and fourth p-wells 82b, 82d can be omitted. In such configurations, the second and sixth p-type active areas 83b, 83f can be formed in second and third n-wells 84b, 84c, respectively, and can operate as the emitters of the first and second open-base PNP bipolar transistors 63a, 63b. Although positioning the second and sixth p-type active areas 83b, 83f in the second and third n-wells 84b, 84c can reduce the robustness of the reverse conduction path relative to the configuration shown in FIG. 3B due to a lower reverse blocking voltage diode formation. Configuring the protection device in this manner can aid in reducing device layout area and reverse diode on-state resistance.

Additionally, in some embodiments, the isolation region defined by the n-type isolation layer 89 and the first and fourth n-wells 84a, 84d can be omitted in favor of isolating the protection device 80 from the substrate 81 in other ways, such as using a silicon on insulator (SOI) process.

In FIGS. 3A and 3B, the protection device 80 is symmetrical about the fourth p-type active area 83d to enhance device current handling capability per unit area. Persons having ordinary skill in the art will appreciate that the teachings herein are also applicable to asymmetric devices. For example, in certain implementations the wells, active areas, and/or other structures of the protection device 80 can be arranged in an asymmetric configuration in which the dimensions of the left-half of the device are different than the dimensions of the right-half of the device. Additionally, although configuring the protection device 80 to include both a left-half and a right-half can aid in reducing the area of the protection device 80 for a given amount of protection current, the teachings herein are applicable to structures including only a left-half or a right-half, such as implementations omitting the fifth to eighth n-type active areas 85e-85h, the fifth to seventh p-type active areas 83e-83g, the second gate oxide layer 86b, the second gate region 87b, the third and fourth n-wells 87c, 87d, and the fourth and fifth p-wells 82d, 82e.

Figure 4:
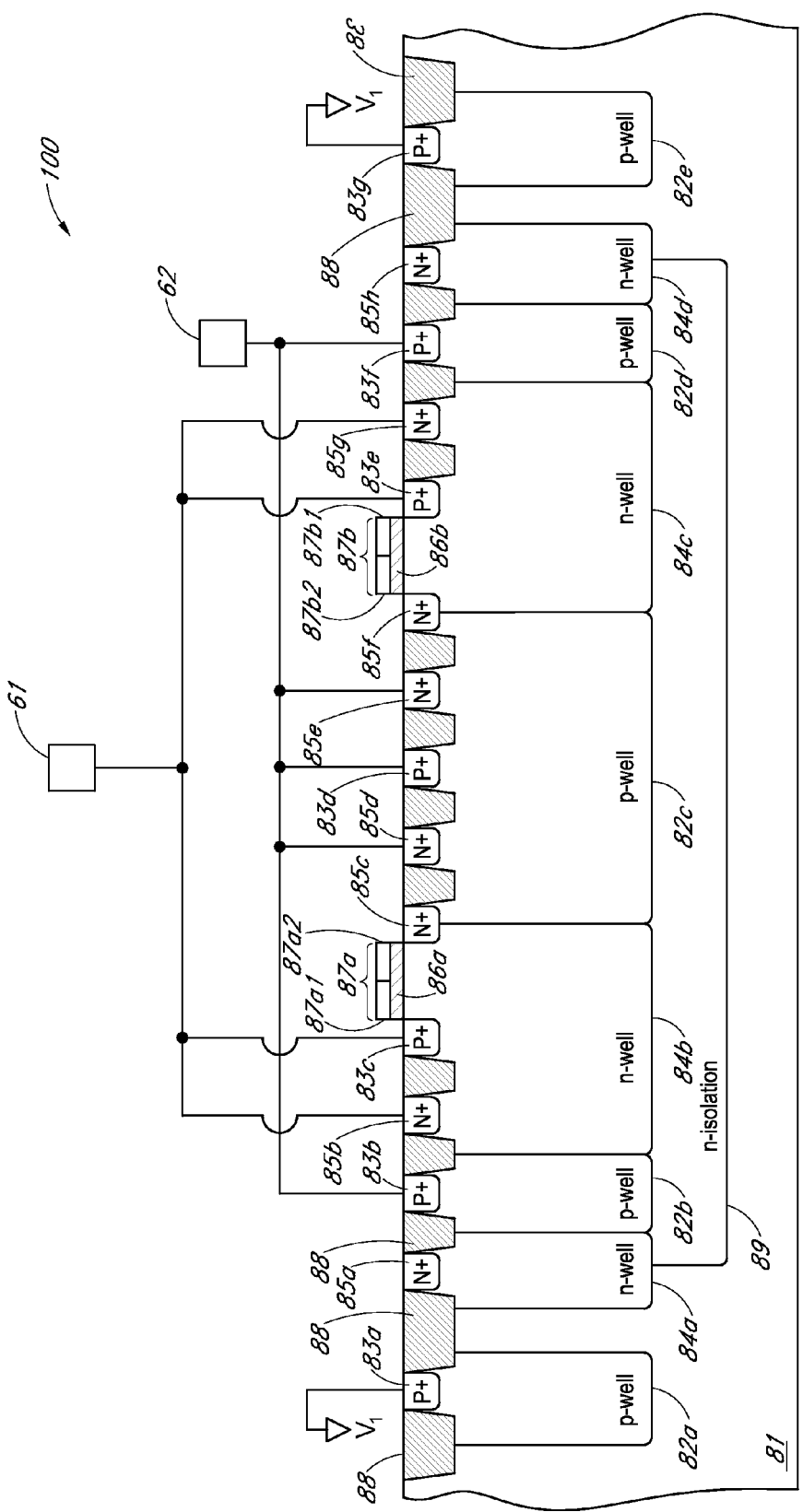
FIG. 4 is a cross section view of another implementation of the protection device of FIG. 3A, taken along the lines 3B-3B.

FIG. 4 is a cross section view of another implementation of the protection device 80 of FIG. 3A, taken along the lines 3B-3B. The protection device 100 of FIG. 4 is similar to the protection device 80 of FIG. 3B, except that the protection device 100 of FIG. 4 illustrates a configuration in which the first pad 61 is further connected to the second and seventh n-type active areas 85b, 85g and in which the second pad 62 is further connected to the fourth p-type active area 83d.

Connecting the first pad 61 to the second and seventh n-type active areas 85b, 85g can reduce the reverse conduction voltage of the protection device 100 relative to the configuration shown in FIG. 3B for negative stress conditions of the first pad 61 relative to the second pad 62. For example, rather than electrically floating the second and third n-wells 84b, 84c and using the first and second open-base PNP bipolar transistors 63a, 63b of FIG. 3B to provide protection against negative transient electrical events, the protection device 100 uses emitter-base diode connected PNP bipolar transistor structures to provide protection against negative transient electrical events. For example, diode structures formed between the second p-well 82b and the second n-well 84b and between the fourth p-well 82d and the third n-well 84c can be used to control the reverse conduction voltage of the protection device 100. Since these diode structures can have a breakdown voltage that is less than a breakdown voltage of the first and second open-base PNP bipolar transistors 63a, 63b of FIG. 3B, the protection device 100 of FIG. 4 can have a lower reverse conduction voltage than the protection device 80 of FIG. 3B. On the other hand, connecting the second and seventh n-type active areas 85b, 85g in this manner can reduce the resistance between the base and emitter of the PNP bipolar transistors 64a, 64b, respectively, thereby increasing the forward conduction voltage.

The protection device 100 also illustrates a configuration in which the second pad 62 is further connected to the fourth p-type active area 83d. Connecting the second pad 62 in this manner can be used to control the electrical potential of the bases of the first and second NPN bipolar transistors 65a, 65b shown in FIG. 3B and to lower base-emitter resistance, which can lead to an increase in the forward trigger voltage of the protection device 100 of FIG. 4 relative to the forward trigger voltage of the protection device 80 of FIG. 3B when the first pad 61 is stressed positive relative to the second pad 62. Connecting the protection device 100 in this manner can provide a high voltage tolerant protection device while maintaining fast response time during transient stress conditions.

Figure 5:
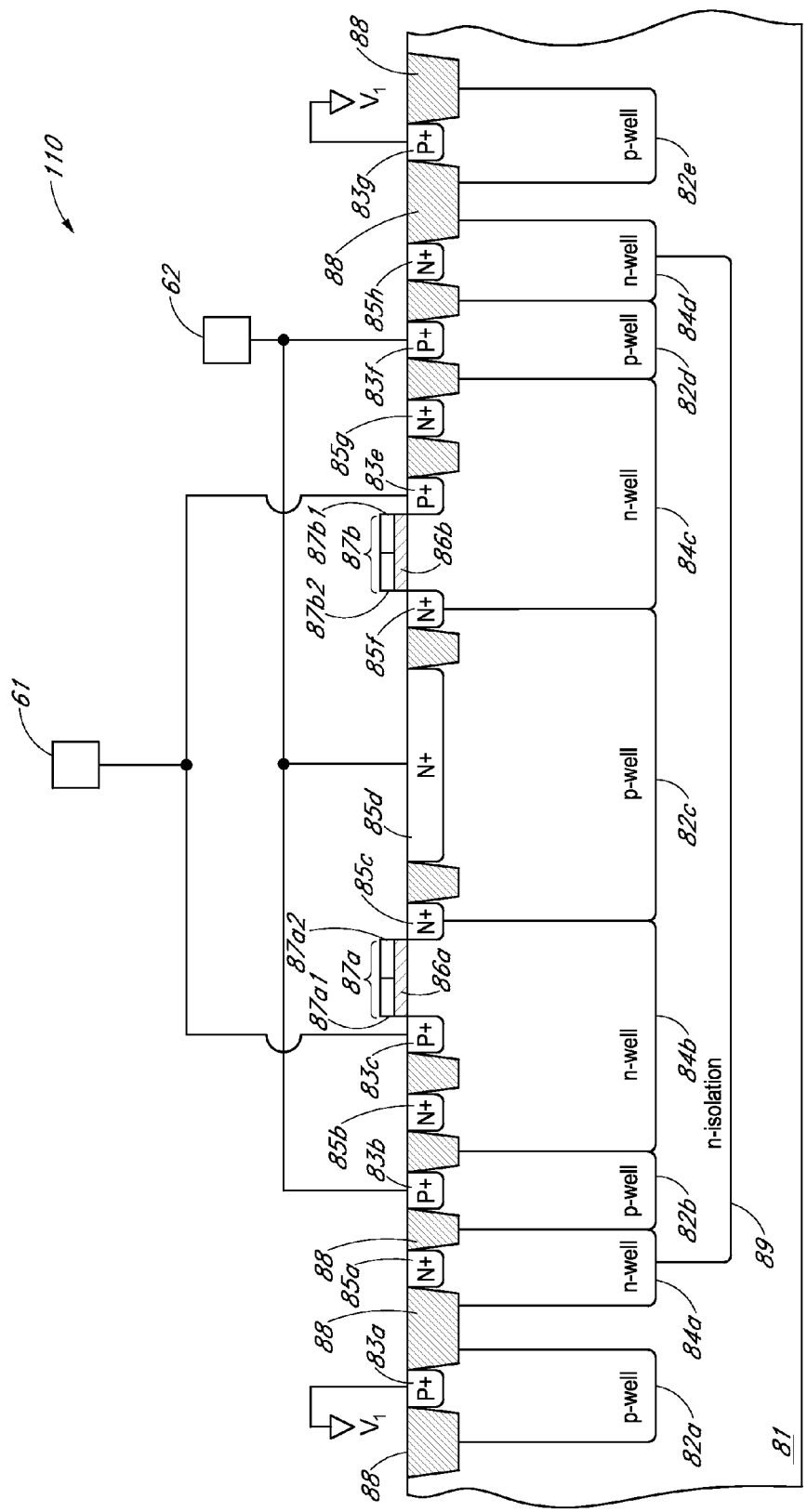
FIG. 5 is a cross section view of another embodiment of a protection device.

FIG. 5 is a cross section view of another embodiment of a protection device 110 in which the third p-well 82c has been configured to be electrically floating. The protection device 110 of FIG. 5 is similar to the protection device 80 of FIG. 3B, except that the protection device 110 of FIG. 5 illustrates a configuration in which the fourth p-type active area 83d and the fifth n-type active area 85e have been omitted. Configuring the protection device 110 in this manner can increase the size of the emitter of the first and second NPN bipolar transistors 65a, 65b shown in FIG. 3B, thereby enhancing current handling capability of the device. Additionally, by omitting the fourth p-type active area 83d and the fifth n-type active area 85e, the protection device 110 can be configured to have a smaller area.

Figure 6A:
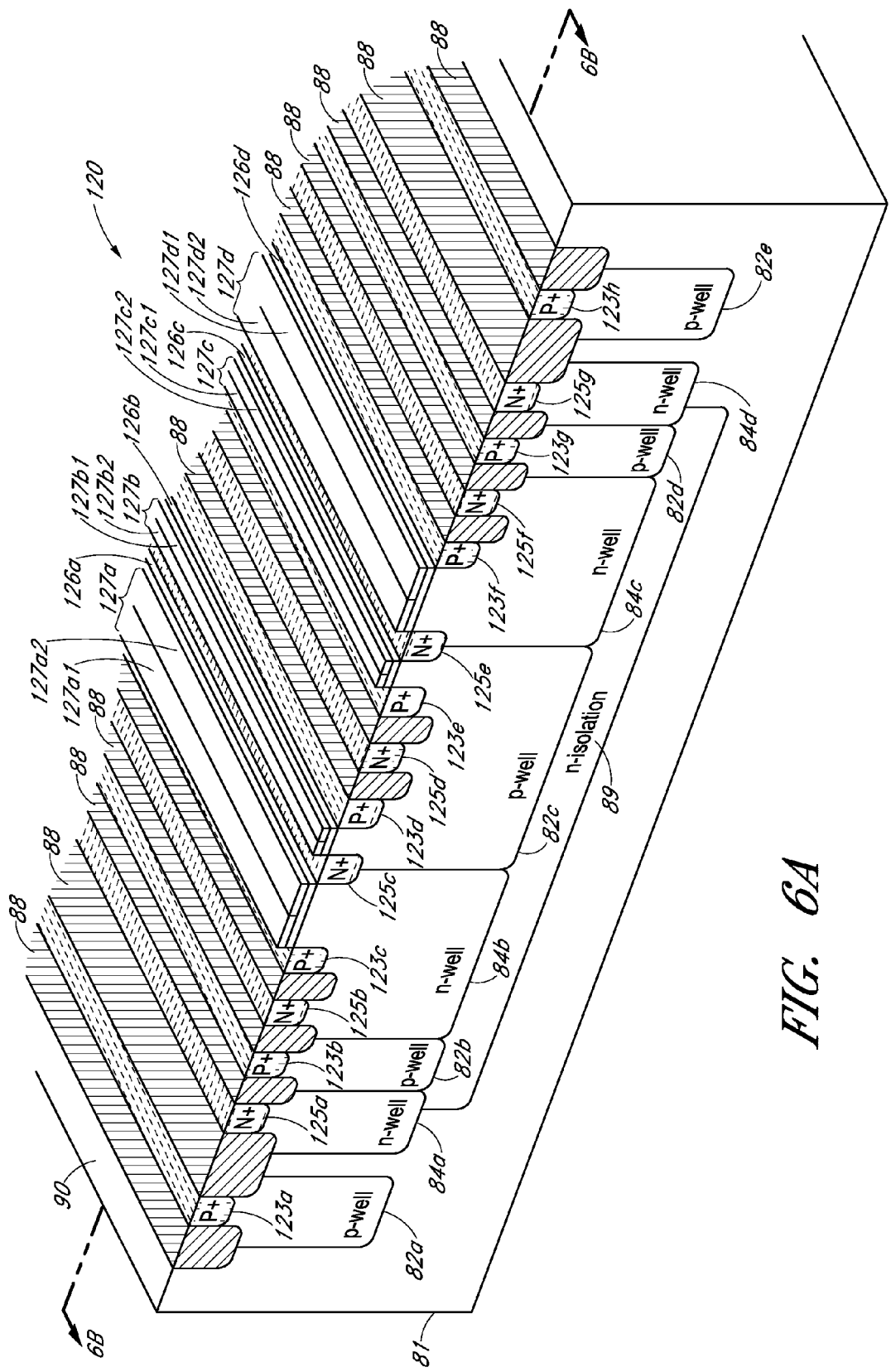
FIG. 6A is a schematic perspective view of a protection device according to another embodiment.

FIG. 6A is a schematic perspective of a protection device 120 according to another embodiment. The protection device 120 includes the p-type substrate 81, the first to fifth p-wells 82a-82e, the first to fourth n-wells 84a-84d, the oxide regions 88, and the n-type isolation layer 89, which can be as described earlier with respect to FIG. 3A. The protection device 120 further includes first to eighth p-type active areas 123a-123h, first to seventh n-type active areas 125a-125g, first to fourth gate oxide layers 126a-126d, and first to fourth gate regions 127a-127d.

The first and eighth p-type active areas 123a, 123h are disposed in the first and fifth p-wells 82a, 82e, respectively. The second and seventh p-type active areas 123b, 123g are disposed in the second and fourth p-wells 82b, 82d, respectively. The first and seventh n-type active areas 125a, 125g are disposed in the first and fourth n-wells 84a, 84d, respectively.

The first and fourth gate oxide layers 126a, 126d are disposed on the surface 90 of the substrate 81 over the second and third n-wells 84b, 84c, respectively. The first and fourth gate regions 127a, 127d are disposed over the first and fourth gate oxide layers 126a, 126d, respectively, and can be poly-silicon layers. The third p-type active area 123c is disposed in the second n-well 84b on a first side of the first gate region 127a. The third n-type active area 125c is disposed on a second side of the first gate region 127a, and includes a first portion disposed in the second n-well 84b and a second portion disposed in the third p-well 82c. The second n-type active area 125b is disposed in the second n-well 84b on a side of the third p-type active area 123c opposite the first gate region 127a. The sixth p-type active area 123f is disposed in the third n-well 84c on a first side of the fourth gate region 127d. The fifth n-type active area 125e is disposed on a second side of the fourth gate region 127d, and includes a first portion disposed in the third n-well 84c and a second portion disposed in the third p-well 82c. The sixth n-type active area 125f is disposed in the third n-well 84c on a side of the sixth p-type active area 123f opposite the fourth gate region 127d.

The second and third gate oxide layers 126b, 126c are disposed on the surface 90 of the substrate 81 over the third p-well 82c. The second and third gate regions 127b, 127c are disposed over the second and third gate oxide layers 126b, 126c, respectively. The fourth p-type active area 123d is disposed in the third p-well 82c on a first side of the second gate region 127b. The third n-type active area 125c is disposed on a second side of the second gate region 127b. The fifth p-type active area 123e is disposed in the third p-well 82c on a first side of the third gate region 127c. The fifth n-type active area 125e is disposed on a second side of the third gate region 127c. The fourth n-type active area 125d is disposed in the third p-well 82c between the fourth and fifth p-type active areas 123d, 123e.

The first gate region 127a includes a first p-type gate region 127a1 adjacent the third p-type active area 123c and a first n-type gate region 127a2 adjacent the third n-type active area 125c. Additionally, the second gate region 127b includes a second p-type gate region 127b1 adjacent the fourth p-type active area 123d and a second n-type gate region 127b2 adjacent the third n-type active area 125c. Furthermore, the third gate region 127c includes a third p-type gate region 127c1 adjacent the fifth p-type active area 123e and a third n-type gate region 127c2 adjacent the fifth n-type active area 125e. Additionally, the fourth gate region 127d includes a fourth p-type gate region 127d1 adjacent the sixth p-type active area 123f and a fourth n-type gate region 127d2 adjacent the fifth n-type active area 125e. As will be described in detail below with respect to FIG. 6B, configuring the first to fourth gate regions 127a-127d to each include a p-type gate region and an n-type gate region can reduce standing power dissipation by eliminating or decreasing surface leakage paths between critical adjacent conduction path in the protection device. Configuring the device in this manner can enhance the turn-on speed of the protection device 120 during a transient electrical event by allowing more uniform current flow laterally without a need for deep inter-well isolations to separate critical active regions of opposite doping polarities.

The protection device 120 can undergo back end processing to form contacts and metallization. Skilled artisans will appreciate that these details have been omitted from this figure for clarity.

Figure 6B:
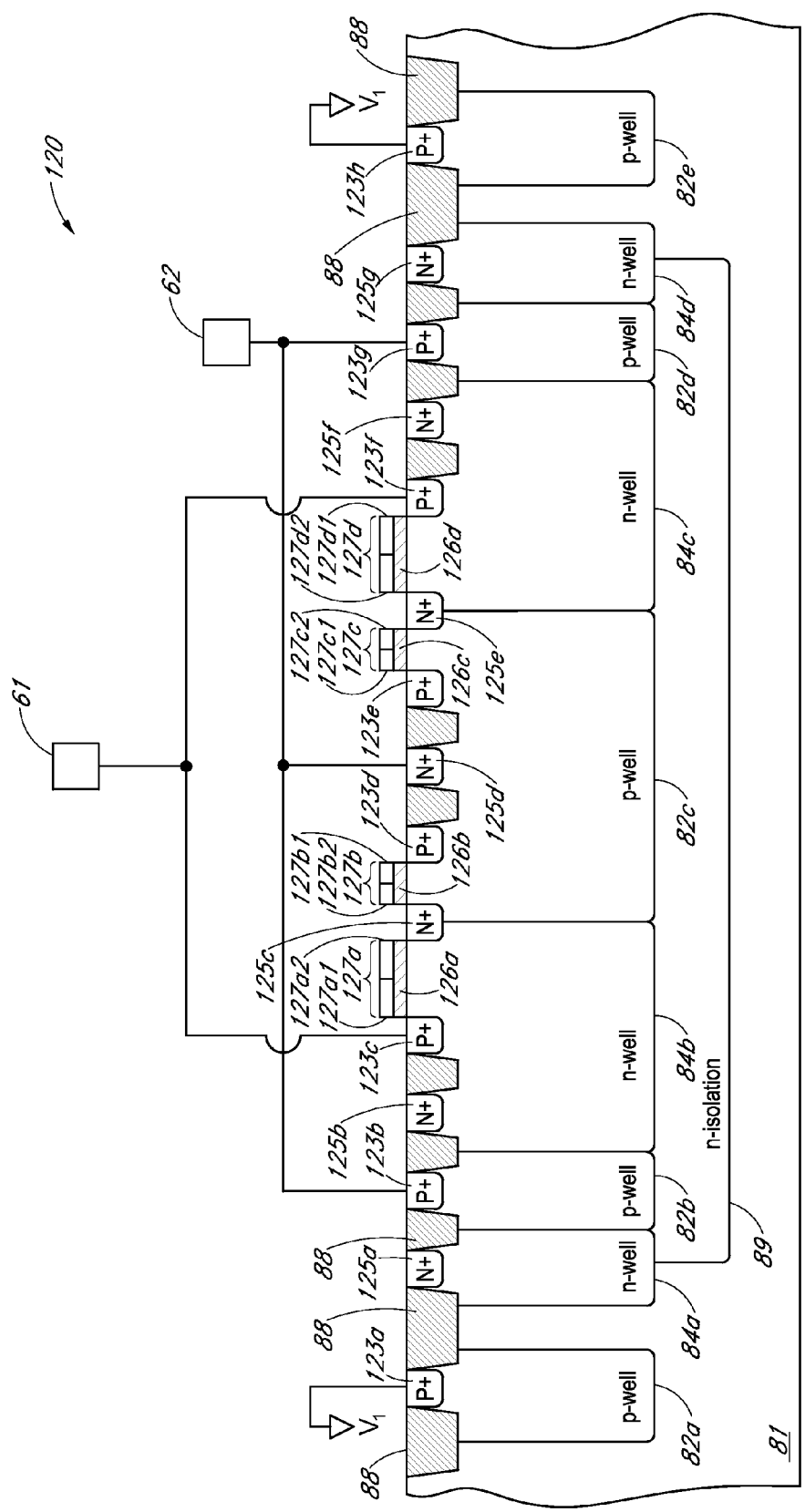
FIG. 6B is a cross section view of the protection device of FIG. 6A, taken along the lines 6B-6B.

FIG. 6B is a cross section view of the protection device 120 of FIG. 6A, taken along the lines 6B-6B. The protection device 120 includes the p-type substrate 81, the first to fifth p-wells 82a-82e, the first to fourth n-wells 84a-84d, the oxide regions 88, the n-type isolation layer 89, the first to eighth p-type active areas 123a-123h, the first to seventh n-type active areas 125a-125g, the first to fourth gate oxide layers 126a-126d, and the first to fourth gate regions 127a-127d, which can be as described above with respect to FIG. 6A. The cross section shows the first and second pads 61, 62 as well as electrical connections within the protection device 120 and to the pads.

The first pad 61 is electrically connected to the third and sixth p-type active areas 123c, 123f. The second pad 62 is electrically connected to the second and seventh p-type active areas 123b, 123g and to the fourth n-type active area 125d. The first and eighth p-type active areas 123a, 123h are electrically connected to the first supply voltage $V_1$, which can be, for example, a power-low or ground supply.

The protection device 120 can protect an IC from a transient electrical event having either positive or negative voltage amplitude in a manner similar to that described earlier with respect to FIG. 3B. However, in contrast to the protection device 80 of FIG. 3B, the protection device 120 of FIG. 6B further includes the second and third gate regions 127b, 127c disposed over the third p-well 82c. Including the second and third gate regions 127b, 127c enhances the turn-on speed of the protection device 120 of FIG. 6B relative to the turn-on speed of the protection device 80 of FIG. 3B by providing an additional path for carriers to reach the third and fifth n-type active areas 125c, 125e. In particular, during a transient signal event that is positive with respect to the first pad 61, the first to fourth gates 127a-127d can each be coupled upward, and conductions paths can be provided under and through each of these gate structures to the third and fifth n-type active areas 125c, 125e. Configuring the protection device 120 to include a dual gate structure in which gates are provided on both sides of the third and fifth n-type active areas 125c, 125e can further enhance carrier injection and device turn-on speed. Additionally, the first to fourth gate regions 127a-127d can include the first to fourth p-type gate regions 127a1-127d1 and the first to fourth n-type gate regions 127a2-127d2, respectively, which can reduce gate resistance by providing a p-n junction diode formation, thereby further reducing the response time at which a lateral conduction path is formed beneath the gate region during a transient overvoltage electrical event.

Although FIG. 6B illustrates one embodiment of the protection device 120, other configurations are possible. For example, in some implementations, the isolation region defined by the n-type isolation layer 89 and the first and fourth n-wells 84a, 84d can be omitted in favor of isolating the protection device 120 from the substrate 81 in other ways. In FIGS. 6A and 6B, the protection device 120 is symmetrical about the fourth n-type active area 125d. However, persons having ordinary skill in the art will appreciate that the teachings herein are also applicable to asymmetric devices.

Figure 7:
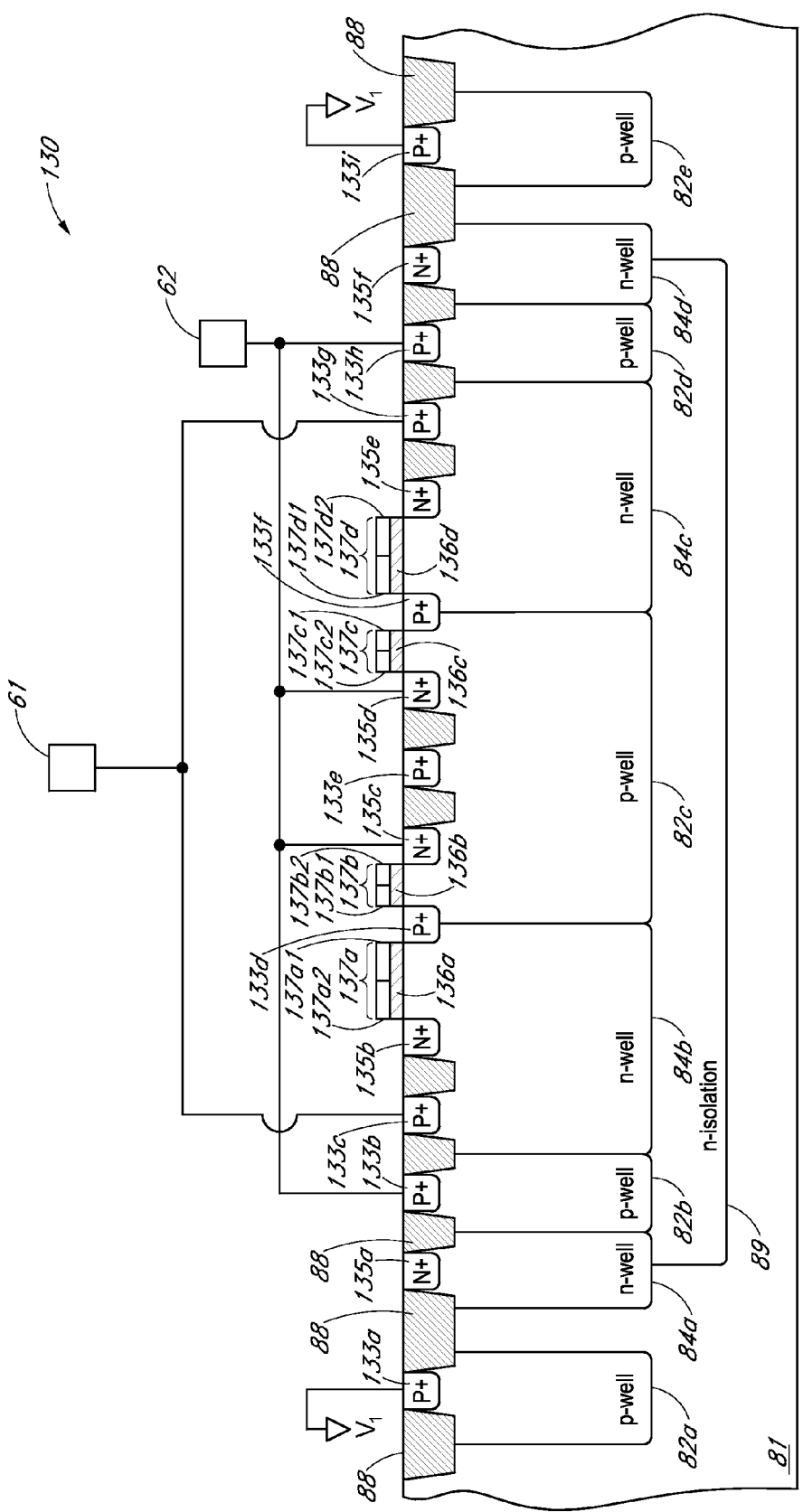
FIG. 7 is a cross section view of another embodiment of a protection device.

FIG. 7 is a cross section view of another embodiment of a protection device 130. The protection device 130 includes the p-type substrate 81, the first to fifth p-wells 82a-82e, the first to fourth n-wells 84a-84d, the oxide regions 88, and the n-type isolation layer 89, which can be as described earlier with respect to FIG. 3A. The protection device 130 further includes first to ninth p-type active areas 133a-133i, first to sixth n-type active areas 135a-135f, first to fourth gate oxide layers 136a-136d and first to fourth gate regions 137a-137d. The cross section shows the first and second pads 61, 62 as well as electrical connections within the protection device 130 and to the pads.

The first and ninth p-type active areas 133a, 133i are disposed in the first and fifth p-wells 82a, 82e, respectively. The second and eighth p-type active areas 133b, 133h are disposed in the second and fourth p-wells 82b, 82d, respectively. The first and sixth n-type active areas 135a, 135f are disposed in the first and fourth n-wells 84a, 84d, respectively.

The first and fourth gate oxide layers 136a, 136d are disposed on the surface 90 of the substrate 81 over the second and third n-wells 84b, 84c, respectively. The first and fourth gate regions 137a, 137d are disposed over the first and fourth gate oxide layers 136a, 136d, respectively, and can be polysilicon layers. The fourth p-type active area 133d is disposed on a first side of the first gate region 137a, and includes a first portion disposed in the second n-well 84b and a second portion disposed in the third p-well 82c. The second n-type active area 135b is disposed in the second n-well 84b on a second side of the first gate region 137a. The third p-type active area 133c is disposed in the second n-well 84b on a side of the second n-type active area 135b opposite the first gate region 137a. The sixth p-type active area 133f is disposed on a first side of the fourth gate region 137d, and includes a first portion disposed in the third n-well 84c and a second portion disposed in the third p-well 82c. The fifth n-type active area 135e is disposed in the third n-well 84c on a second side of the fourth gate region 137d. The seventh p-type active area 133g is disposed in the third n-well 84c on a side of the fifth n-type active area 135e opposite the fourth gate region 137d.

The second and third gate oxide layers 136b, 136c are disposed on the surface 90 of the substrate 81 over the third p-well 82c. The second and third gate regions 137b, 137c are disposed over the second and third gate oxide layers 136b, 136c, respectively. The fourth p-type active area 133d is disposed on a first side of the second gate region 137b. The third n-type active area 135c is disposed in the third p-well 82c on a second side of the second gate region 137b. The sixth p-type active area 133f is disposed on a first side of the third gate region 137c. The fourth n-type active area 135d is disposed in the third p-well 82c on a second side of the third gate region 137c. The fifth p-type active area 133e is disposed in the third p-well 82c between the third and fourth n-type active areas 135c, 135d.

The first gate region 137a includes a first p-type gate region 137a1 adjacent the fourth p-type active area 133d and a first n-type gate region 137a2 adjacent the second n-type active area 135b. Additionally, the second gate region 137b includes a second p-type gate region 137b1 adjacent the fourth p-type active area 133d and a second n-type gate region 137b2 adjacent the third n-type active area 135c. Furthermore, the third gate region 137c includes a third p-type gate region 137c1 adjacent the sixth p-type active area 133f and a third n-type gate region 137c2 adjacent the fourth n-type active area 135d. Additionally, the fourth gate region 137d includes a fourth p-type gate region 137d1 adjacent the sixth p-type active area 133f and a fourth n-type gate region 137d2 adjacent the fifth n-type active area 135e.

The first pad 61 is electrically connected to the third and seventh p-type active areas 133c, 133g. The second pad 62 is electrically connected to the second and eighth p-type active areas 133b, 133h and to the third and fourth n-type active areas 135c, 135d for low trigger operation, while other configurations can be used for higher trigger voltage operation as discussed earlier in connection with FIG. 4. The first and ninth p-type active areas 133a, 133i are electrically connected to the first supply voltage $V_1$, which can be, for example, a power-low or ground supply.

The protection device 130 can protect an IC from a transient electrical event having either positive or negative voltage amplitude in a manner similar to that described earlier with respect to FIG. 6B. For example, persons having ordinary skill in the art will appreciate that the protection device 130 of FIG. 7 illustrates a complimentary configuration of the protection device 120 of FIG. 6 in which the doping polarities of the active areas formed in the second and third n-wells 84b, 84c and the third p-well 82c has been reversed for blocking voltage adjustment. For example, in contrast to the configuration illustrated in FIG. 6B which can define a highly doped n-type active to p-well blocking junction, the configuration illustrated in FIG. 7 can define a highly doped p-type active to n-well blocking junction. Configuring the protection device in this manner can help protect IC pins in ultra low leakage applications, while maintaining robustness and fast response during transient stress conditions.

Skilled artisans will appreciate that lateral spacing defined for the different embodiments can be configured to follow minimum design rules of the technology they are fabricated in. Thus, device construction can vary depending on the technology node. For instance, for sub-60 nm technologies, minimum feature spacing between highly doped active regions can be, for example, in the range of about 0.18 μm to about 0.3 μm, for instance about 0.26 μm, and minimum gate length can be in the range of about 0.1 μm to about 0.5 μm, for instance about 0.36 μm.

Figure 8:
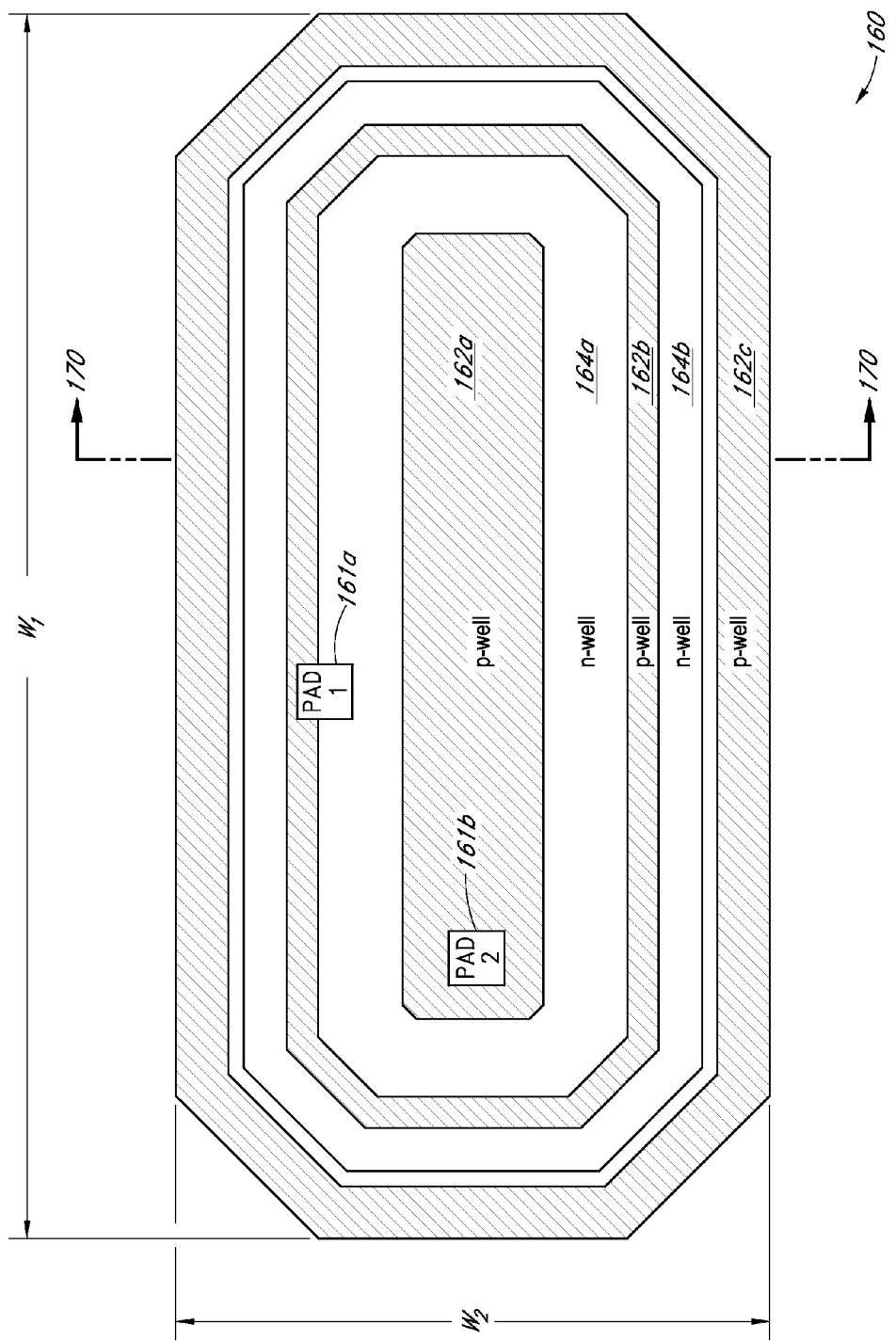
FIG. 8 is a schematic top plan layout view of a protection device according to one embodiment.

FIG. 8 is a schematic top plan layout view of a protection device 160 according to one embodiment. The protection device 160 includes a first pad 161a, a second pad 161b, first to third p-wells 162a-162c, and first and second n-wells 164a, 164b. Although only certain structures of the protection device 160 have been illustrated in FIG. 8, the protection device 160 can include other structures, such as contacts and metallization, oxide regions, active areas, gate structures, shallow wells, and/or deep wells. Skilled artisans will appreciate that these details have been omitted from FIG. 8 for clarity.

As shown in FIG. 8, the first p-well 162a has been configured as an island, and the first n-well 164a has been configured as a first ring that surrounds and abuts the first p-well 162a. Additionally, the second p-well 162b has been configured as a second ring that surrounds and abuts the first n-well 164a. Furthermore, the second n-well 164b has been configured as a third ring that surrounds and abuts the second p-well 162b. Additionally, the third p-well 162c has been configured as a fourth ring that surrounds, but does not abut, the second n-well 164b. The first pad 161a has been formed over a portion of the first n-well 164a and over a portion of the second p-well 162b. The second pad 161b has been formed over the first p-well 162a. Although FIG. 8 illustrates one specific configuration of a protection device, other implementations are possible, such as rounded and single-side configurations adapted to chip-level layout, bonding, and/or packaging constraints can be practiced without departing from the teachings herein. It will be understood that the lines do not need to be straight or parallel.

The protection device 160 can be configured to provide protection to circuitry electrically connected to the first and second pads 161a, 161b. For example, in one implementation, the first pad 161 is a signal pad and the second pad is a power-low pad that is isolated from power-low pads used to control the electrical potential of the substrate that the protection device 160 is formed in. Although one configuration of the connectivity of the protection device 160 has been described, the protection device 160 can be connected to pads in other ways.

The protection device 160 of FIG. 8 illustrates one example of an annular implementation of the protection devices described herein for low capacitance loading. For example, when the protection device 160 is viewed along the lines 170-170, the protection device 160 can have a similar cross section to the cross sections of the protection devices shown in FIG. 3B, 4, 5, 6B, or 7. Accordingly, in certain implementations the first p-well 162a of FIG. 8 can correspond to the third p-well 82c of FIGS. 3A, 3B, 4, 5, 6A, 6B, and 7, the first n-well 164a of FIG. 8 can correspond to the second and third n-wells 84b, 84c of FIGS. 3A, 3B, 4, 5, 6A, 6B, and 7, and the second p-well 162b of FIG. 8 can correspond to the second and fourth p-wells 82b, 82d of FIGS. 3A, 3B, 4, 5, 6A, 6B, and 7. Furthermore, the second n-well 164b of FIG. 8 can correspond to the first and fourth n-wells 84a, 84d of FIGS. 3A, 3B, 4, 5, 6A, 6B, and 7, and the third p-well 162c of FIG. 8 can correspond to the first and fifth p-wells 82a, 82e of FIGS. 3A, 3B, 4, 5, 6A, 6B, and 7.

As described above, the correspondence between wells of the protection device 160 of FIG. 8 and the wells of the protection devices shown in FIGS. 3A, 3B, 4, 5, 6A, 6B, and 7 need not be one-to-one. For example the first n-well 164a of FIG. 8 can be a ring that surrounds the first p-well 162a, and thus the first n-well 164a can operate as both the second and third n-wells 84b, 84c shown in FIGS. 3A, 3B, 4, 5, 6A, 6B, and 7. Configuring one or more wells as rings can help improve the current handling capability and/or reduce the footprint of the protection device.

In one embodiment, the footprint of the protection device 160 in sub 60-nm scale feature technology has a width $W_1$ in the range of about 35 μm to about 170 μm, for example, about 40 μm for sub 300 fF capacitive loading range, and a length $W_2$ in the range of about 10 μm to about 20 μm, for example, about 14 μm. However, other dimensions will be readily determined by one of skill in the art and process technology features.

FIGS. 9A-9E are graphs of laboratory demonstrating data for one implementations of the protection device 80 of FIGS. 3A and 3B. The graphs correspond to a configuration of the protection device 80 developed in a 180 nm CMOS process, capable of sustaining over 4 kV human body model (HBM), and having an area of about 74×25=1850 μm² including the device guard ring structures. Although FIGS. 9A-9E illustrate laboratory data for one implementation of the protection device 80, the protection device 80 can be configured to have different electrical characteristics, such as those suited for a particular electronic system or application.

Figure 9A:
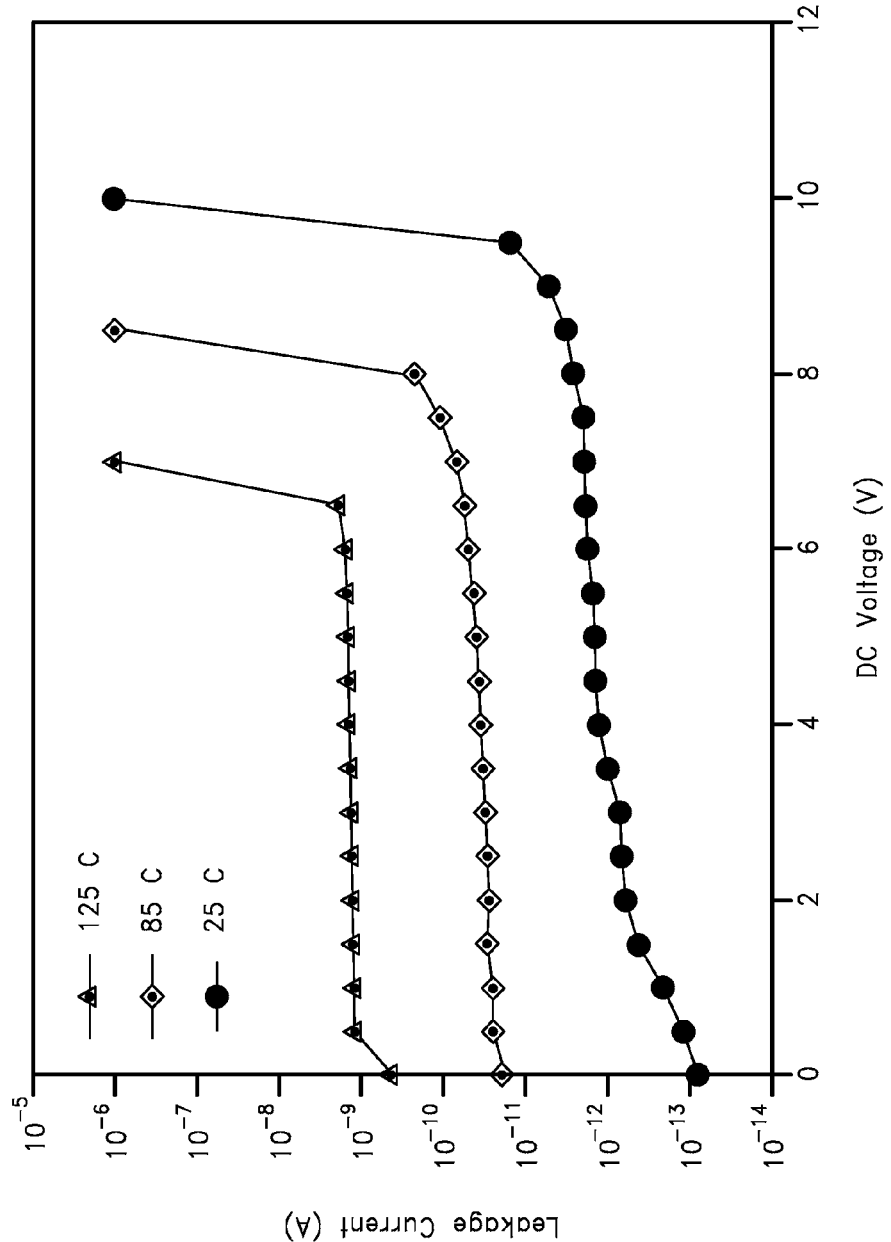
FIGS. 9A-9E are graphs of laboratory data for one implementation of the protection device of FIGS. 3A and 3B.

FIG. 9A is a graph 200 of leakage current versus DC voltage. The graph 200 includes three plots of leakage current versus voltage corresponding to laboratory data taken at temperatures of 25° C., 85° C., and 125° C. A relatively small variation of leakage current across DC voltage can indicate the integrity and robustness of a protection device. As shown in FIG. 9A, the illustrated embodiment of the protection device can sustain a DC voltage of about 6.5 V for temperatures up to about 125° C. while keeping the leakage below tens of nA at the highest operating temperature.

Figure 9B:
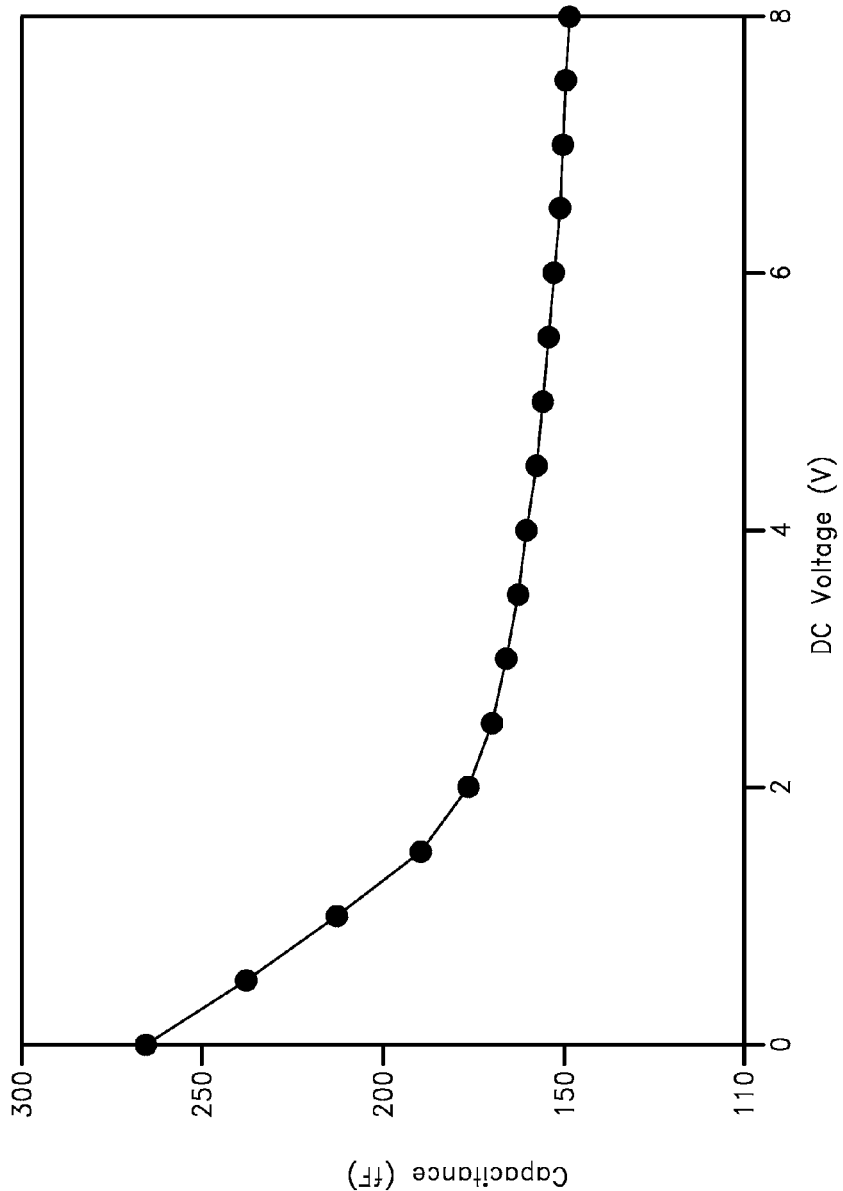

FIG. 9B is a graph 210 of capacitance versus DC voltage. The graph 210 illustrates that the protection device can be configured to have a relatively small capacitance, such as a capacitance of less than about 300 fF even when configured to sustain over 4 kV HBM. Accordingly, the protection device can be used in various high speed applications, such as to protect signal pads operating at frequencies of up to about 5 GHz.

Figure 9C:
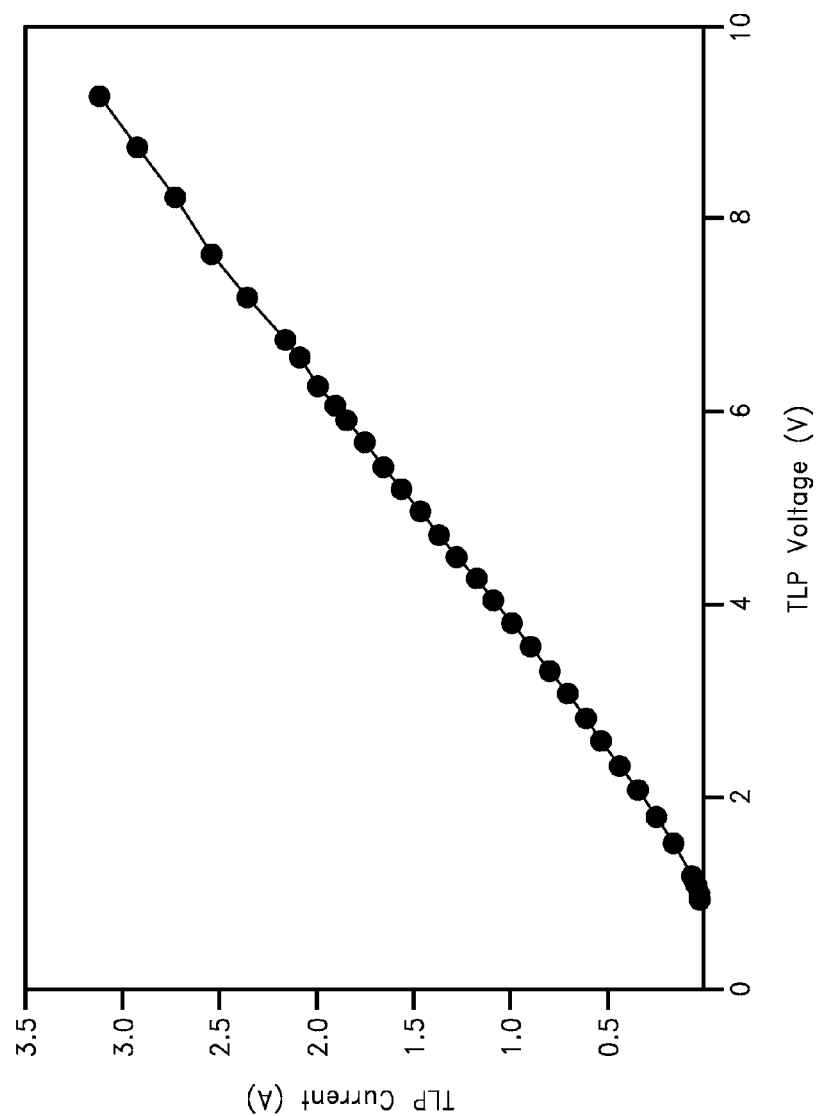

FIG. 9C is a graph 220 of transmission line pulse (TLP) current versus TLP voltage for a negative transient electrical event. The measurements were taken at about room temperature, and each TLP measurement point can correspond to a voltage and a current measurement obtained by forcing a rectangular 100 ns current pulse having about a 10 ns rise time out of the protection device and measuring the voltage of the protection device between about 40% and about 90% of the current pulse width.

Figure 9D:
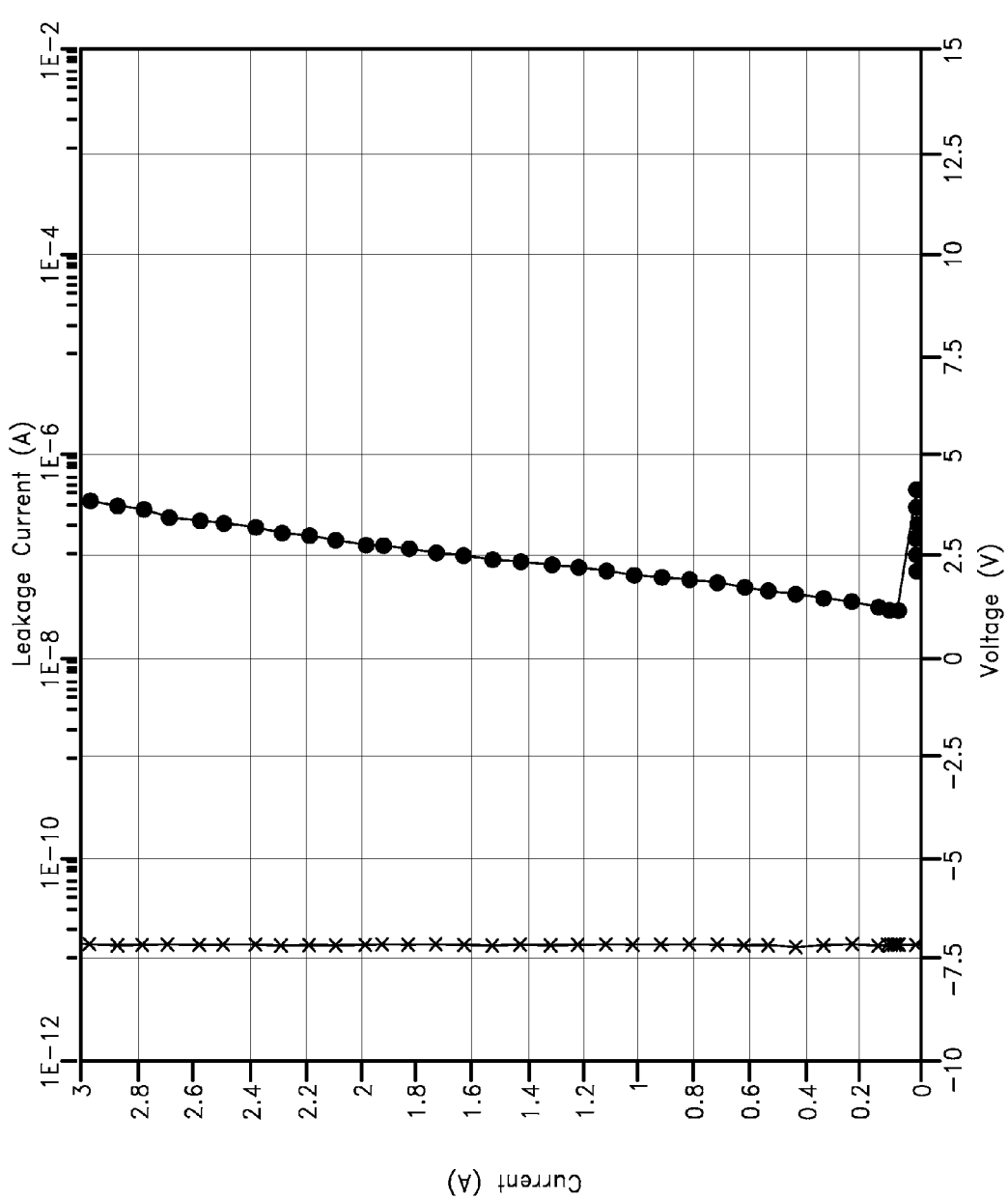

FIG. 9D is a graph 230 of TLP laboratory data for a positive transient electrical event. The measurements were taken at about room temperature, and each TLP measurement point can correspond to a voltage and a current measurement obtained by forcing a rectangular 100 ns current pulse having about a 10 ns rise time into the protection device and measuring the voltage of the protection device between about 40% and about 90% of the current pulse width. The plot of leakage current corresponds to DC leakage at about 6 V after each TLP current pulse. As skilled artisans will appreciate, a relatively small variation in the leakage current value after each pulse can indicate the integrity of the IC. In contrast, drastic change in the leakage current can indicate IC damage. For the illustrated implementation, the protection device can have a trigger voltage of about 4.5 V and a holding voltage of about 2.5 V. Additionally, the leakage current of the protection device can be below about 100 pA at voltages as high as 6 V. Thus, the leakage current of the protection device and standing power dissipation can be relatively low and extend the battery lifetime in portable applications, and can have a relatively small variation across TLP current. This can indicate the integrity and robustness of the IC using the protection device after passage of transient electrical events.

Figure 9E:
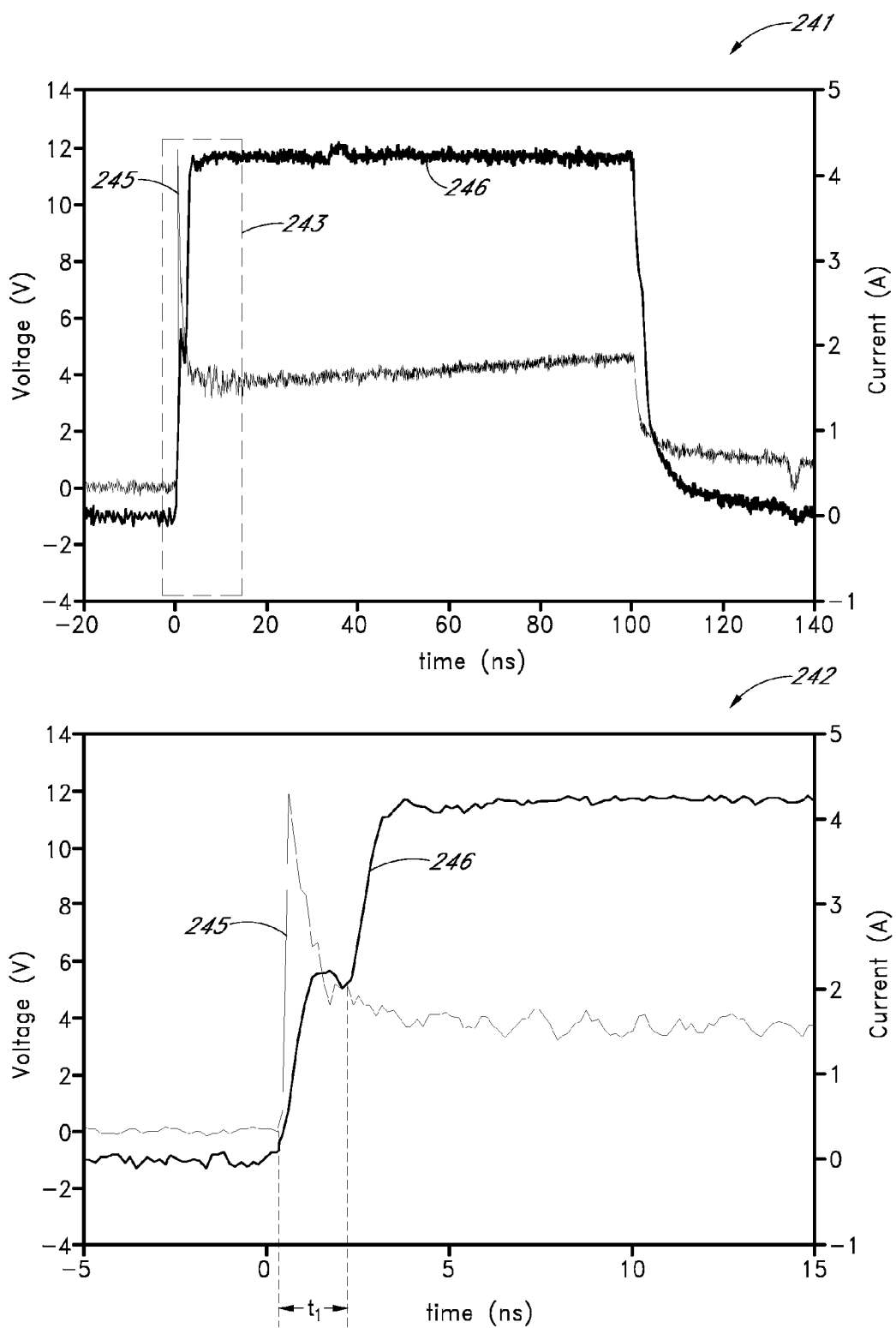

FIG. 9E illustrates a first graph 241 of voltage and current versus time and a second graph 242 of voltage and current versus time. The first graph 241 includes a first plot 245 of voltage versus time and a second plot 246 of current versus time. A portion 243 of the first graph 241 has been expanded to form the second graph 242. The first and second graphs 241, 242 illustrate transient voltage and current versus time when a TLP stress condition correlating an HBM ESD event of about 5 kV is applied between the two pads of the device. The pulse starts at time 0 ns and ending at time 100 ns.

As shown in FIG. 9E, the protection device can be configured to have a relatively fast response turn-on time. For example, the protection device has been configured to limit the voltage overshoot to about 12 V, and to have an activation time $t_1$ that is in the range of about 2 ns. In the illustrated configuration, the protection device provides a protection current of over 4 A of TLP current.

Figure 10A:
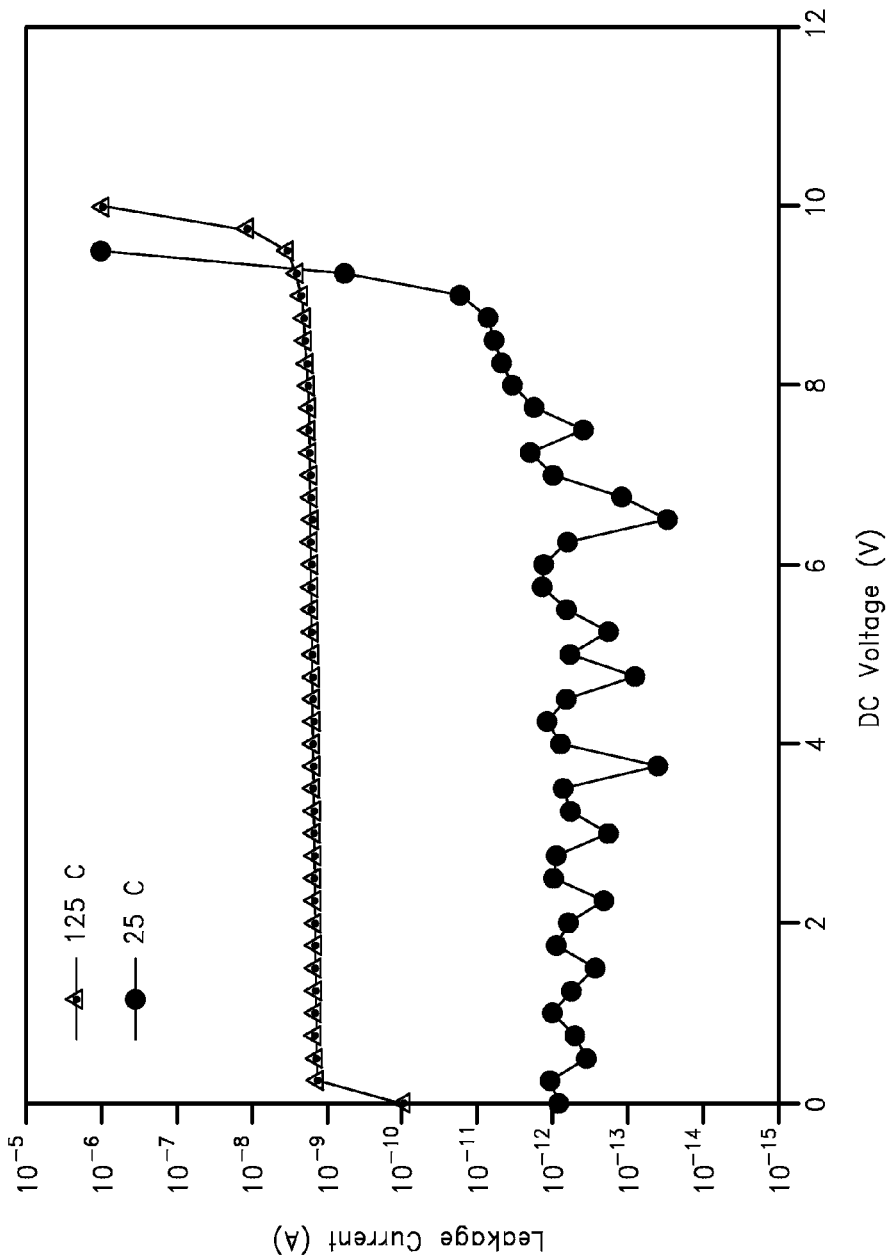
FIGS. 10A-10C are graphs of laboratory data for one implementation of the protection device of FIG. 4.
Figure 10B:
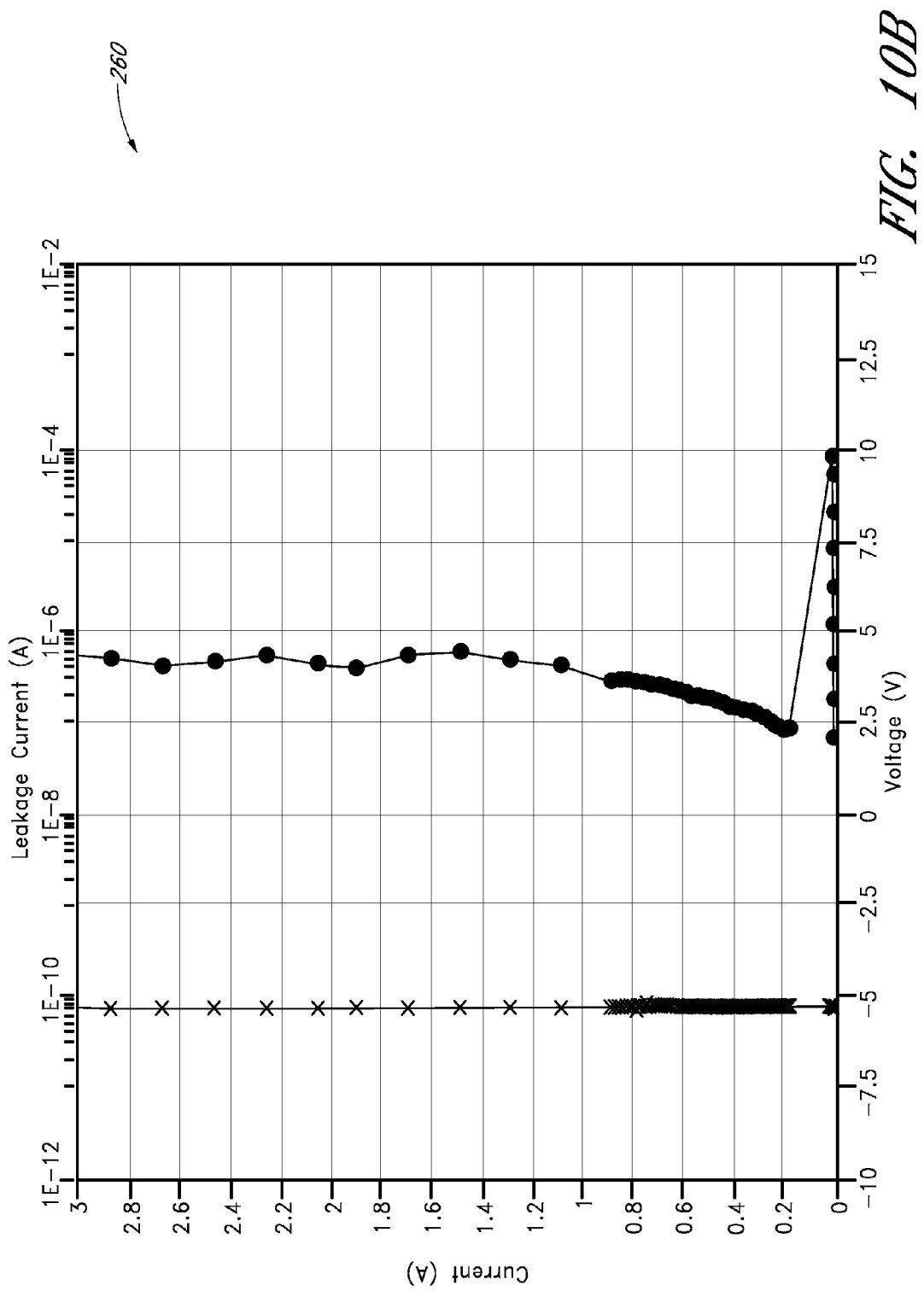
Figure 10C:
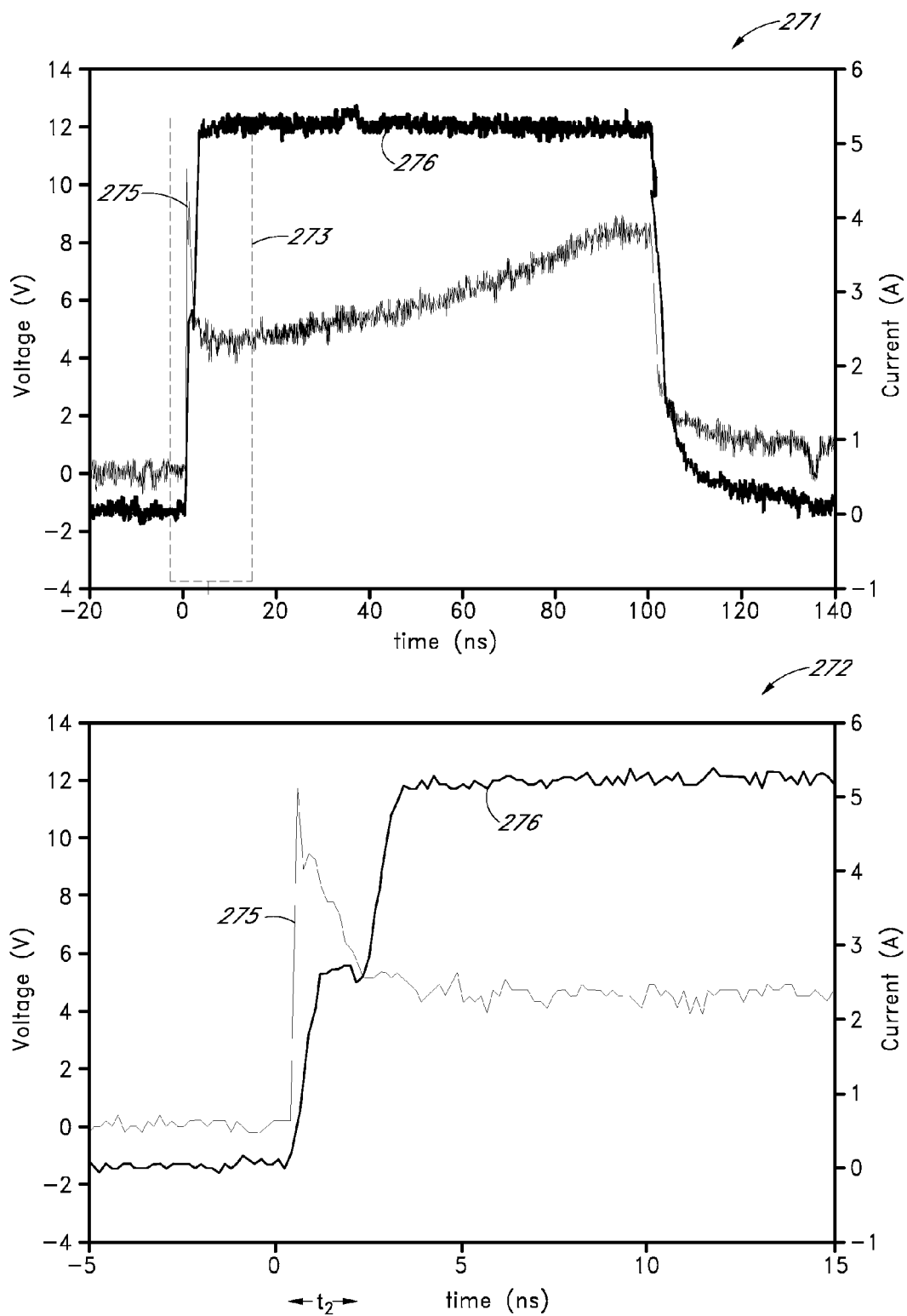

FIGS. 10A-10C are graphs of laboratory data for one implementation of the protection device 100 of FIG. 4. The graphs correspond to a configuration of the protection device 100 developed in a 180 nm CMOS process, capable of sustaining over 4 kV human body model (HBM), and having an area of about 74×25=1850 µm² including the device guard ring structures. Although FIGS. 10A-10C illustrate laboratory data for one implementation of the protection device 100, the protection device 100 can be configured to have different electrical characteristics, such as those suited for a particular low capacitance, high ESD robustness and/or high voltage tolerant electronic system or application.

FIG. 10A is a graph 250 of leakage current versus DC voltage. The graph 250 includes two corner temperature operation plots of leakage current versus voltage corresponding to laboratory data taken at temperatures of 25° C. and 125° C. As shown in FIG. 10A, the illustrated embodiment of the protection device can sustain a DC blocking voltage of about 9 V for temperatures up to about 125° C. In contrast to the DC plots of FIG. 9A, the DC breakdown voltage of the protection device increases for higher temperatures. This is caused by PNP bipolar transistor structures being connected to the pads rather than being used in open-base configurations. Accordingly, such structures control can be dominated by the reverse junction breakdown of the collector-base junctions of NPN bipolar transistor structures rather than by cross-coupled bipolar transistor action.

FIG. 10B is a graph 260 of TLP laboratory data for a positive transient electrical event. The measurements were taken at about room temperature, and each TLP measurement point can correspond to a voltage and a current measurement obtained by forcing a rectangular 100 ns current pulse having about a 10 ns rise time into the protection device and measuring the voltage of the protection device between about 40% and about 90% of the current pulse width. The plot of leakage current corresponds to DC leakage at about 6 V after each TLP current pulse. For the illustrated implementation, the protection device can have a trigger voltage of about 10 V and a holding voltage of about 2.5 V. Additionally, the leakage current of the protection device can be below about 10 pA at voltages as high as 7V, allowing for ultra low leakage operation and higher voltage tolerant circuit input/output interface operation.

FIG. 10C illustrates a first graph 271 of voltage and current versus time and a second graph 272 of voltage and current versus time. The first graph 271 includes a first plot 275 of voltage versus time and a second plot 276 of current versus time. A portion 273 of the first graph 271 has been expanded to form the second graph 272. The first and second graphs 271, 272 illustrate transient voltage and current versus time when a TLP stress condition corresponding to an HBM ESD event of about 5 kV is applied between two pads of the device. The pulse starts at time 0 ns and ending at time 100 ns.

As shown in FIG. 10C, the protection device can be configured to have a relatively fast response turn-on time. For example, the protection device has been configured to limit the voltage overshoot to about 12 V, and to have an activation time $t_2$ that is in the range of about 2 ns when a high stress current is applied between the pads of the device. In the illustrated configuration, the protection device provides a protection current of over 5 A.

In contrast to the plots illustrated in FIGS. 9A-9E, the plots illustrated in FIGS. 10A-10C do not include plots of capacitance versus DC voltage and TLP current versus TLP voltage for a negative transient electrical event. Since the range and tendency of the specific laboratory data for the implementation of the protection device 100 associated with FIGS. 10A-10C provided similar results to those previously illustrated in FIGS. 9B and 9C, these details have been omitted for clarity.

While illustrated in the context of a p-type semiconductor substrate, the principles and advantages described herein are also applicable to an n-type configuration where the doping polarities are reversed. For example, an n-type substrate can be provided rather than a p-type substrate, and wells and active areas of an opposite doping type can be provided in the n-type substrate. Furthermore, certain implementations described herein can be applicable to undoped substrates, such as substrates used in certain silicon-on-insulator (SOI) technologies.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products, including those for industrial, medical and automotive applications.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A protection device for a mixed-signal integrated circuit, the protection device comprising:
    a semiconductor substrate;
    a first n-type well in the semiconductor substrate;
    a first p-type well in the semiconductor substrate adjacent the first n-type well;
    a first n-type active region disposed along a boundary of the first n-type well and the first p-type well;
    a second n-type active region in the first p-type well;
    a first p-type active region in the first n-type well;
    a gate structure over the first n-type well, wherein the first p-type active region is disposed on a first side of the gate structure, and wherein the first n-type active region is disposed on a second side of the gate structure opposite the first side;
    a second p-type well in the semiconductor substrate, wherein the first n-type well is positioned between the first p-type well and the second p-type well; and
    an n-type isolation layer beneath the first p-type well, the first n-type well, and the second p-type well.

2. The protection device of claim 1, further comprising a first pad electrically connected to the first p-type active region and a second pad electrically connected to the second n-type active region.

3. The protection device of claim 2, wherein during a transient overvoltage stress event between the first pad and the second pad, a first conduction path is provided under the gate structure and a second conduction path is provided through gate coupling to decrease a turn-on response time and reduce a transient breakdown voltage between the first n-type well and the first p-type well during the transient overvoltage stress event.

4. The protection device of claim 3, wherein the first gate structure comprises a p-type doped poly-crystalline gate region adjacent the first p-type active region and an n-type doped poly-crystalline gate region adjacent the first n-type active region.

5. The protection device of claim 1, further comprising a second p-type active region disposed in the second p-type well, wherein the second p-type active region is electrically connected to the second n-type active region.

6. The protection device of claim 5, further comprising a first pad electrically connected to the first p-type active region and a second pad electrically connected to the second n-type active region and to the second p-type active region.

7. The protection device of claim 1, wherein the first n-type well is implemented as a first ring that surrounds and abuts the first p-type well.

8. The protection device of claim 7, wherein the second p-type well is implemented as a second ring that surrounds and abuts the first n-type well.

9. The protection device of claim 8, further comprising a second n-type well, wherein the second n-type well is implemented as a third ring that surrounds and abuts the second p-type well.

10. The protection device of claim 9, further comprising a third p-type well, wherein the third p-type well is implemented as a fourth ring that surrounds, but does not abut, the second n-type well.

11. The protection device of claim 1, further comprising a second n-type well, wherein the second p-type well is positioned between the first n-type well and the second n-type well, wherein the second n-type well is electrically connected to the first n-type well via the n-type isolation layer.

12. The protection device of claim 1, wherein the first p-type well is electrically connected to the second p-type well.

13. An integrated circuit comprising:
    a first pin;
    a semiconductor substrate; and
    a protection device comprising:
        a first n-type well in the semiconductor substrate;
        a first p-type well in the semiconductor substrate adjacent the first n-type well;
        a first n-type active region disposed along a boundary of the first n-type well and the first p-type well;
        a second n-type active region in the first p-type well;
        a first p-type active region in the first n-type well and electrically connected to the first pin;
        a gate structure over the first n-type well, wherein the first p-type active region is disposed on a first side of the gate structure, and wherein the first n-type active region is disposed on a second side of the gate structure opposite the first side;
        a second p-type well in the semiconductor substrate, wherein the first n-type well is positioned between the first p-type well and the second p-type well; and
        a means for isolating the protection device from the semiconductor substrate.

14. A method of making a protection device, the method comprising:
    forming an n-type isolation layer in a semiconductor substrate;
    forming a first n-type well in the semiconductor substrate over the n-type isolation layer;
    forming a first p-type well in the semiconductor substrate adjacent the first n-type well and over the n-type isolation layer;

forming a second p-type well in the semiconductor substrate over the n-type isolation layer, wherein the first n-type well is positioned between the first p-type well and the second p-type well;

forming a gate structure over the first n-type well;

forming a first n-type active region along a boundary of the first n-type well and the first p-type well;

forming a second n-type active region in the first p-type well; and forming a first p-type active region in the first n-type well, wherein the first p-type active region is disposed on a first side of the gate structure, and wherein the first n-type active region is disposed on a second side of the gate structure opposite the first side.

15. The method of claim 14, further comprising forming a second p-type active region in the second p-type well, and electrically connecting the second p-type active region to the second n-type active region.

16. The method of claim 14, further comprising electrically connecting the first p-type well to the second p-type well.

17. The method of claim 14, wherein forming the first n-type well comprising forming a first ring that surrounds and abuts the first p-type well.

18. The method of claim 17, wherein forming the second p-type well comprises forming a second ring that surrounds and abuts the first n-type well.

19. The method of claim 18, further comprising forming a second n-type well as a third ring that surrounds and abuts the second p-type well.

20. The method of claim 19, further comprising forming a third p-type well as a fourth ring that surrounds, but does not abut, the second n-type well.

\* \* \* \* \*